(12) United States Patent
Lin et al.

(10) Patent No.: US 10,867,861 B2
(45) Date of Patent: Dec. 15, 2020

(54) FIN FIELD-EFFECT TRANSISTOR DEVICE AND METHOD OF FORMING THE SAME

(71) Applicant: Taiwan Semiconductor Manufacturing Company, Ltd., Hsinchu (TW)

(72) Inventors: Tzu-Ching Lin, Hsinchu (TW); Chien-Chih Lin, Taichung (TW); Feng-Ching Chu, Pingtung (TW); Li-Li Su, ChuBei (TW); Chii-Horng Li, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/424,067

(22) Filed: May 28, 2019

(65) Prior Publication Data
US 2020/0105606 A1 Apr. 2, 2020

Related U.S. Application Data

(60) Provisional application No. 62/738,654, filed on Sep. 28, 2018.

(51) Int. Cl.
*H01L 21/8234* (2006.01)
*H01L 29/78* (2006.01)
(Continued)

(52) U.S. Cl.
CPC ........... *H01L 21/823431* (2013.01); *H01L 21/02521* (2013.01); *H01L 21/3086* (2013.01); *H01L 21/823437* (2013.01); *H01L 21/823468* (2013.01); *H01L 27/0886* (2013.01); *H01L 29/0649* (2013.01); *H01L 29/24* (2013.01);
(Continued)

(58) Field of Classification Search
CPC ..... H01L 21/823431; H01L 21/823487; H01L 21/823821; H01L 27/0886; H01L 27/0924; H01L 29/36; H01L 29/66545; H01L 29/66795
See application file for complete search history.

(56) References Cited

U.S. PATENT DOCUMENTS 8,962,400 B2 2/2015 Tsai et al.
9,093,514 B2 7/2015 Tsai et al.
(Continued)

*Primary Examiner* — Hsien Ming Lee
(74) *Attorney, Agent, or Firm* — Slater Matsil, LLP

(57) ABSTRACT

A method of forming a semiconductor device includes forming a fin protruding above a substrate; forming a gate structure over the fin; forming a recess in the fin adjacent to the gate structure; and forming a source/drain region in the recess, the source/drain region including a first layer, a second layer, and a third layer, where forming the source/drain region includes performing a first epitaxy process under first process conditions to form the first layer in the recess, the first layer extending along surfaces of the fin exposed by the recess; performing a second epitaxy process under second process conditions to form the second layer over the first layer; and performing a third epitaxy process under third process conditions to form the third layer over the second layer, the third layer filling the recess, where the first processing conditions, the second process conditions and the third process conditions are different.

20 Claims, 20 Drawing Sheets

(51) Int. Cl.

| | |
|---|---|
| *H01L 29/66* | (2006.01) |
| *H01L 29/06* | (2006.01) |
| *H01L 21/308* | (2006.01) |
| *H01L 29/24* | (2006.01) |
| *H01L 27/088* | (2006.01) |
| *H01L 21/02* | (2006.01) |
| *H01L 29/36* | (2006.01) |

(52) U.S. Cl.
CPC ........ *H01L 29/36* (2013.01); *H01L 29/66545* (2013.01); *H01L 29/66795* (2013.01); *H01L 29/785* (2013.01)

(56) References Cited

U.S. PATENT DOCUMENTS

| | | |
|---|---|---|
| 9,236,267 B2 | 1/2016 | De et al. |
| 9,245,805 B2 | 1/2016 | Yeh et al. |
| 9,520,482 B1 | 4/2016 | Chang et al. |
| 9,418,897 B1 | 8/2016 | Ching et al. |
| 9,576,814 B2 | 2/2017 | Wu et al. |
| 9,608,116 B2 | 3/2017 | Ching et al. |
| 9,647,122 B2 * | 5/2017 | Chang ............... H01L 29/66636 |
| 9,812,363 B1 | 11/2017 | Liao et al. |
| 9,859,380 B2 | 1/2018 | Lee et al. |
| 10,032,873 B2 * | 7/2018 | Chang ................ H01L 29/0657 |
| 2018/0076326 A1 * | 3/2018 | Roh .................. H01L 21/02576 |

* cited by examiner

FIN FIELD-EFFECT TRANSISTOR DEVICE AND METHOD OF FORMING THE SAME

PRIORITY CLAIM AND CROSS-REFERENCE

This application claims priority to U.S. Provisional Patent Application No. 62/738,654, filed Sep. 28, 2018, entitled "Fin Field-Effect Transistor Device and Method of Forming the Same," which application is hereby incorporated by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a FinFET device, and in particular, in the context of forming source/drain regions of a FinFET device. Although the disclosed embodiments are discussed using FinFET devices as examples, the disclosed method may also be used in other types of devices, such as planar devices.

Figure 1:
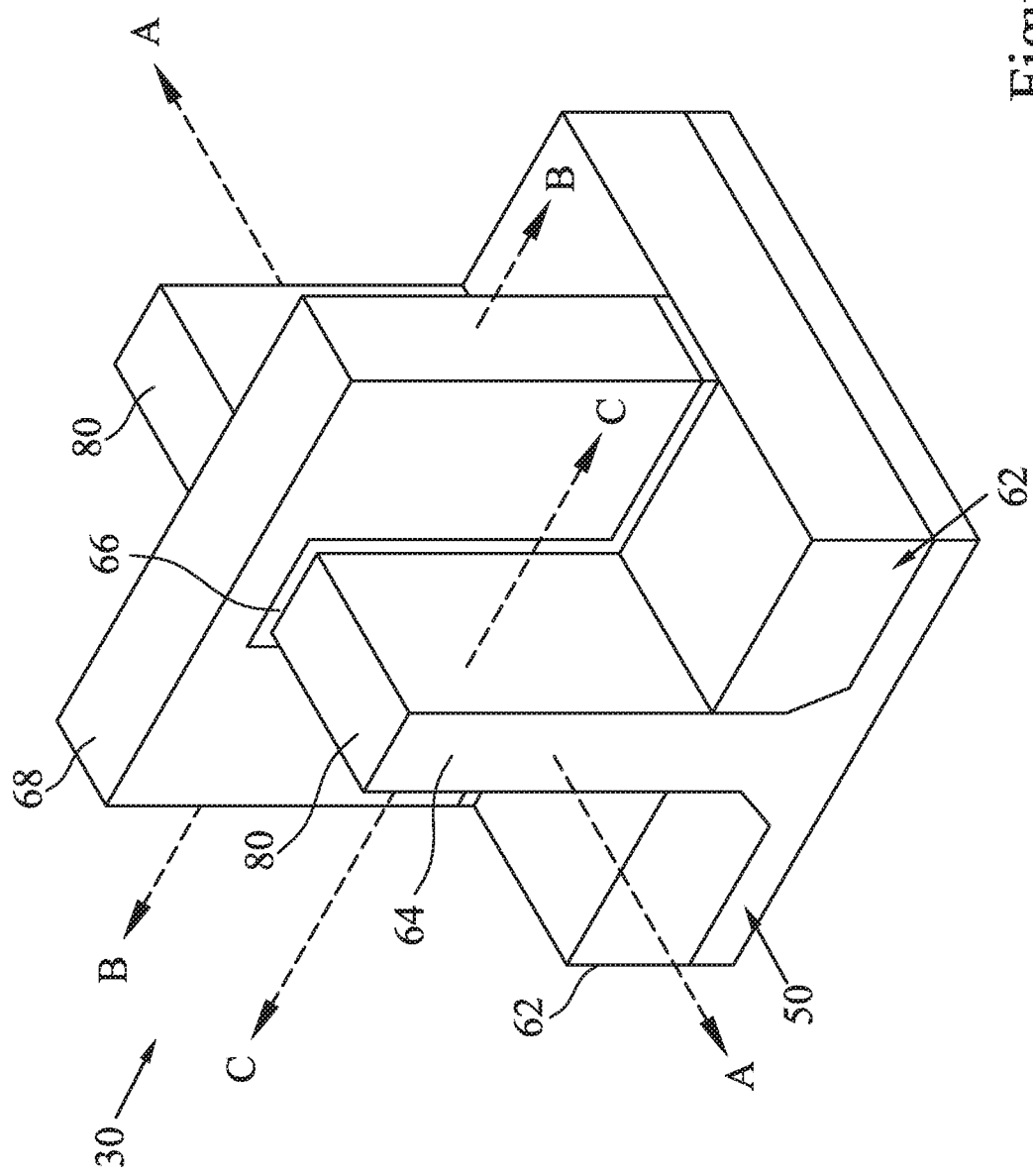
FIG. 1 illustrates a perspective view of a Fin Field-Effect Transistor (FinFET) device, in accordance with some embodiments.

FIG. 1 illustrates an example of a FinFET 30 in a perspective view. The FinFET 30 includes a substrate 50 and a fin 64 protruding above the substrate 50. Isolation regions 62 are formed on opposing sides of the fin 64, with the fin 64 protruding above the isolation regions 62. A gate dielectric 66 is along sidewalls and over a top surface of the fin 64, and a gate 68 is over the gate dielectric 66. Source/drain regions 80 are in the fin 64 and on opposing sides of the gate dielectric 66 and the gate 68. FIG. 1 further illustrates reference cross-sections that are used in later figures. Cross-section B-B extends along a longitudinal axis of the gate 68 of the FinFET 30. Cross-section A-A is perpendicular to cross-section B-B and is along a longitudinal axis of the fin 64 and in a direction of, for example, a current flow between the source/drain regions 80. Cross-section C-C is parallel to cross-section B-B and is across the source/drain region 80. Subsequent figures refer to these reference cross-sections for clarity.

FIGS. 2-9, 10A-10C, 11A, 11B, 12, 13, 14A, and 14B are cross-sectional views of a FinFET device 100 at various stages of fabrication in accordance with some embodiments. The FinFET device 100 is similar to the FinFET 30 in FIG. 1, but with multiple fins and multiple gate structures. FIGS. 2-5 illustrate cross-sectional views of the FinFET device 100 along cross-section B-B. FIGS. 6-9, and 10A illustrate cross-sectional views of the FinFET device 100 along cross-section A-A. FIGS. 10B and 10C illustrate cross-sectional views of the FinFET device 100 along cross-section C-C. FIGS. 11A, 12, 13, and 14A illustrate cross-sectional views of the FinFET device 100 along cross-section A-A, and FIGS. 11B and 14B illustrates cross-sectional views of the FinFET device 100 along cross-section B-B.

Figure 2:
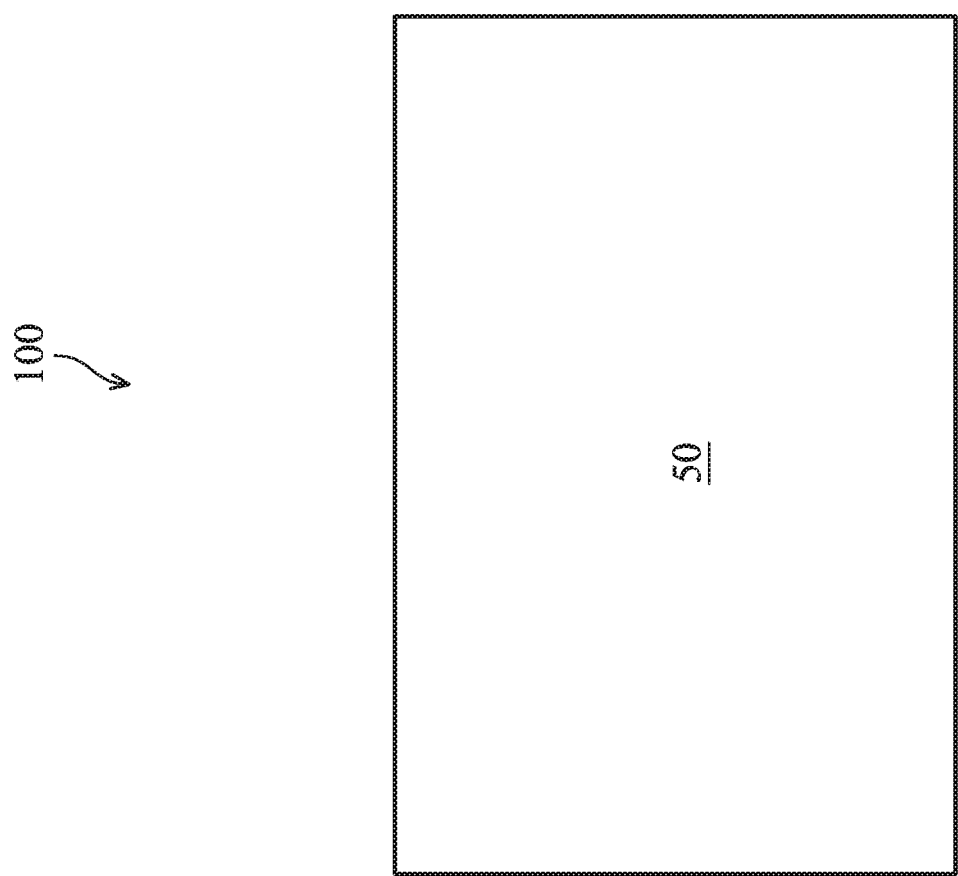
FIGS. 2-9, 10A-10C, 11A, 11B, 12, 13, 14A, and 14B illustrate various cross-sectional views of a FinFET device at various stages of fabrication, in accordance with an embodiment.

FIG. 2 illustrates a cross-sectional view of the substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
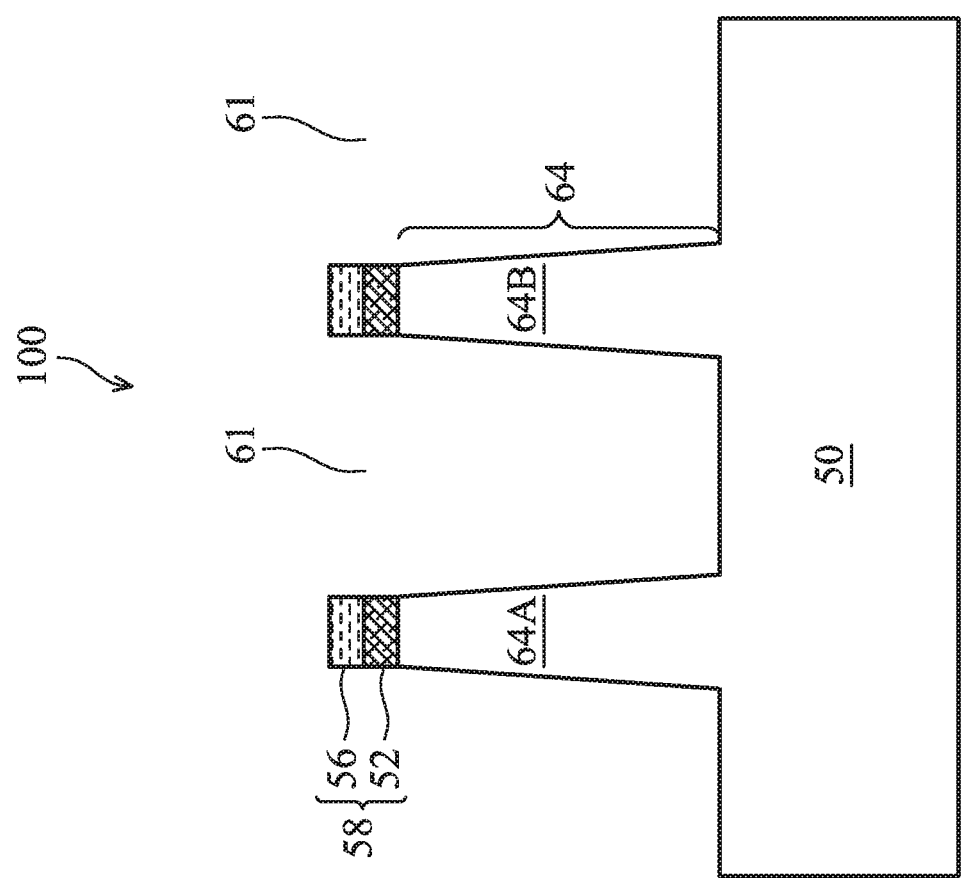

Referring to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56. In some embodiments, the pad nitride layer 56 is formed of silicon nitride, silicon oxynitride, silicon carbide, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58, as illustrated in FIG. 3.

The patterned mask 58 is subsequently used to pattern exposed portions of the substrate 50 to form trenches 61, thereby defining semiconductor fins 64 (e.g., 64A and 64B) between adjacent trenches 61 as illustrated in FIG. 3. In some embodiments, the semiconductor fins 64 are formed by etching trenches in the substrate 50 using, for example, reactive ion etch (RIE), neutral beam etch (NBE), the like, or a combination thereof. The etch may be anisotropic. In some embodiments, the trenches 61 may be strips (viewed from in the top) parallel to each other, and closely spaced with respect to each other. In some embodiments, the trenches 61 may be continuous and surround the semiconductor fins 64. The semiconductor fins 64 may also be referred to as fins 64 hereinafter.

The fins 64 may be patterned by any suitable method. For example, the fins 64 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
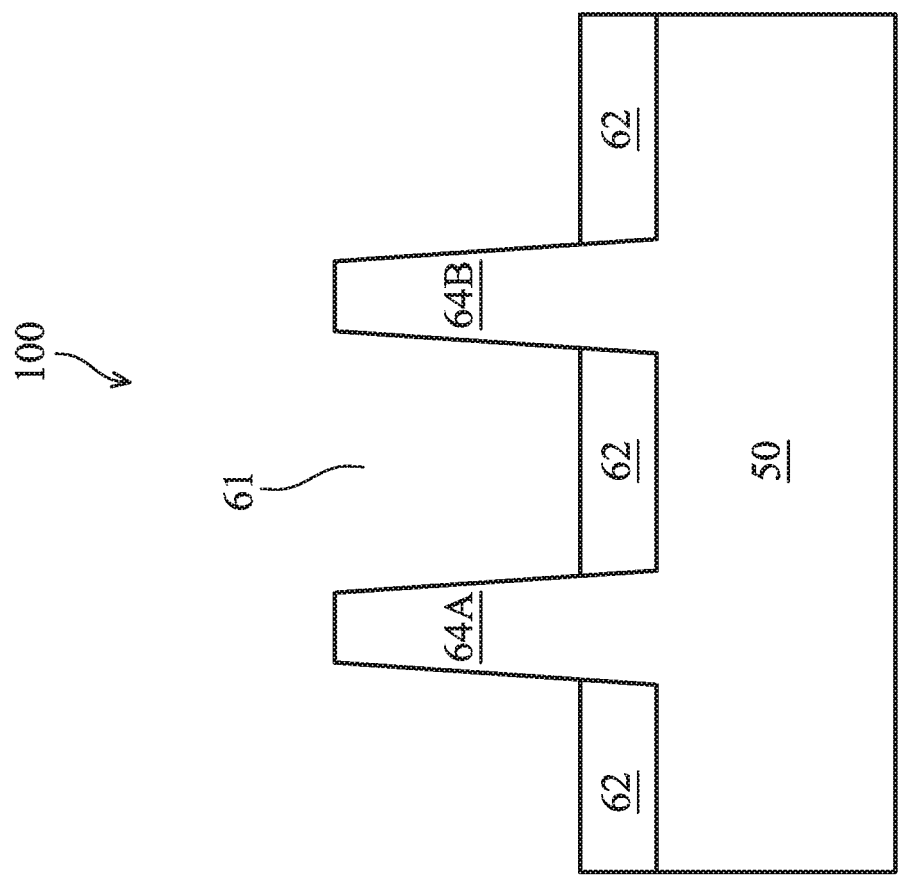

FIG. 4 illustrates the formation of an insulation material between neighboring semiconductor fins 64 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 62 and top surfaces of the semiconductor fins 64 that are coplanar (not shown). The patterned mask 58 (see FIG. 3) may also be removed by the planarization process.

In some embodiments, the isolation regions 62 include a liner, e.g., a liner oxide (not shown), at the interface between the isolation region 62 and the substrate 50/semiconductor fins 64. In some embodiments, the liner oxide is formed to reduce crystalline defects at the interface between the substrate 50 and the isolation region 62. Similarly, the liner oxide may also be used to reduce crystalline defects at the interface between the semiconductor fins 64 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed to form shallow trench isolation (STI) regions 62. The isolation regions 62 are recessed such that the upper portions of the semiconductor fins 64 protrude from between neighboring STI regions 62. The top surfaces of the STI regions 62 may have a flat surface (as illustrated), a convex surface, a concave surface (such as dishing), or a combination thereof. The top surfaces of the STI regions 62 may be formed flat, convex, and/or concave by an appropriate etch. The isolation regions 62 may be recessed using an acceptable etching process, such as one that is selective to the material of the isolation regions 62. For example, a dry etch or a wet etch using dilute hydrofluoric (dHF) acid may be performed to recess the isolation regions 62.

FIGS. 2 through 4 illustrate an embodiment of forming fins 64, but fins may be formed in various different processes. For example, a top portion of the substrate 50 may be replaced by a suitable material, such as an epitaxial material suitable for an intended type (e.g., N-type or P-type) of semiconductor devices to be formed. Thereafter, the substrate 50, with epitaxial material on top, is patterned to form semiconductor fins 64 that comprise the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 64 may comprise silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
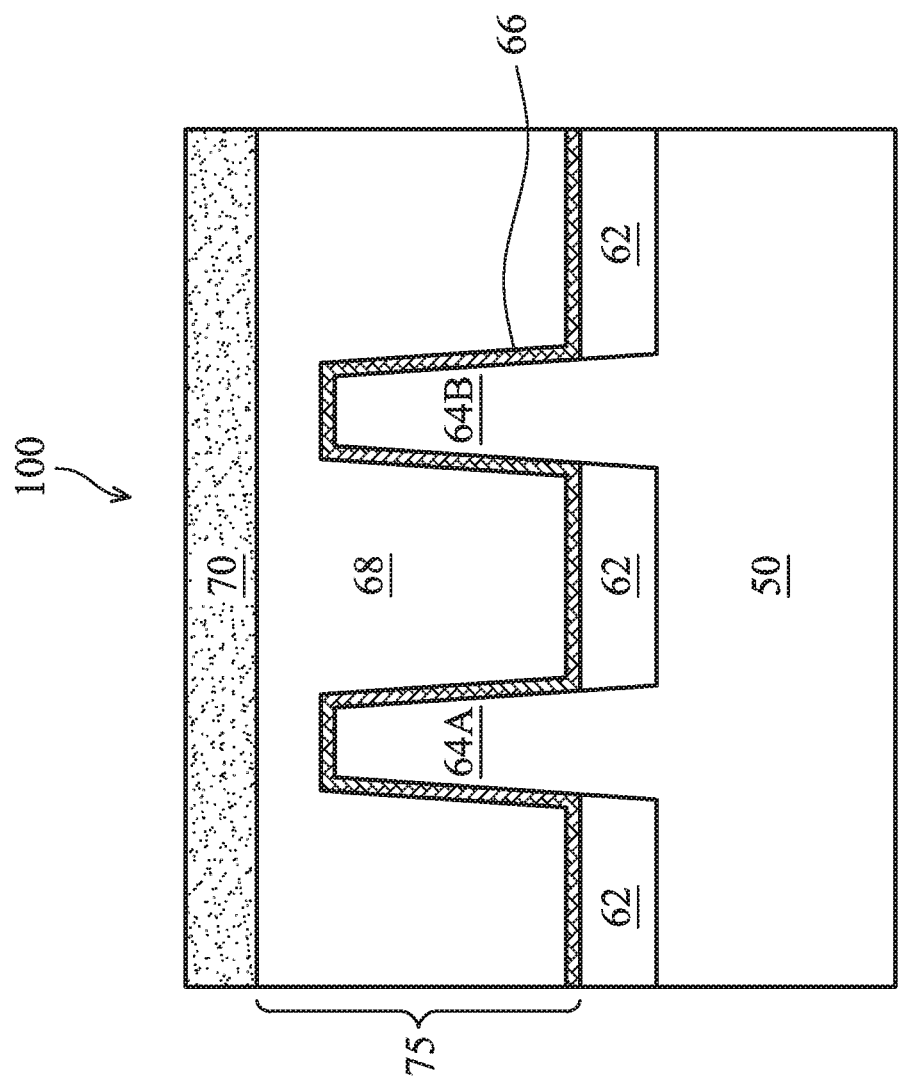

FIG. 5 illustrates the formation of dummy gate structure 75 over the semiconductor fins 64. Dummy gate structure 75 includes gate dielectric 66 and gate 68, in some embodiments. A mask 70 may be formed over the dummy gate structure 75. To form the dummy gate structure 75, a dielectric layer is formed on the semiconductor fins 64. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form mask 70. The pattern of the mask 70 then may be transferred to the gate layer and the dielectric layer by an acceptable etching technique to form gate 68 and gate dielectric 66, respectively. The gate 68 and the gate dielectric 66 cover respective channel regions of the semiconductor fins 64. The gate 68 may also have a lengthwise direction substantially perpendicular to the lengthwise direction of respective semiconductor fins 64.

The gate dielectric 66 is shown to be formed over the fins 64 (e.g., over top surfaces and sidewalls of the fins 64) and over the STI regions 62 in the example of FIG. 5. In other embodiments, the gate dielectric 66 may be formed by, e.g., thermal oxidization of a material of the fins 64, and therefore, may be formed over the fins 64 but not over the STI regions 62. These and other variations are fully intended to be included within the scope of the present disclosure.

FIGS. 6-10 and 11A illustrate the cross-sectional views of further processing of the FinFET device 100 along cross-section A-A (along a longitudinal axis of the fin 64). Note that in FIGS. 6-10 and 11A, three dummy gate structures 75 (e.g., 75A, 75B, and 75C) are formed over the fin 64. One skilled in the art will appreciate that more or less than three gate structures may be formed over the fin 64, these and other variations are fully intended to be included within the scope of the present disclosure.

Figure 6:
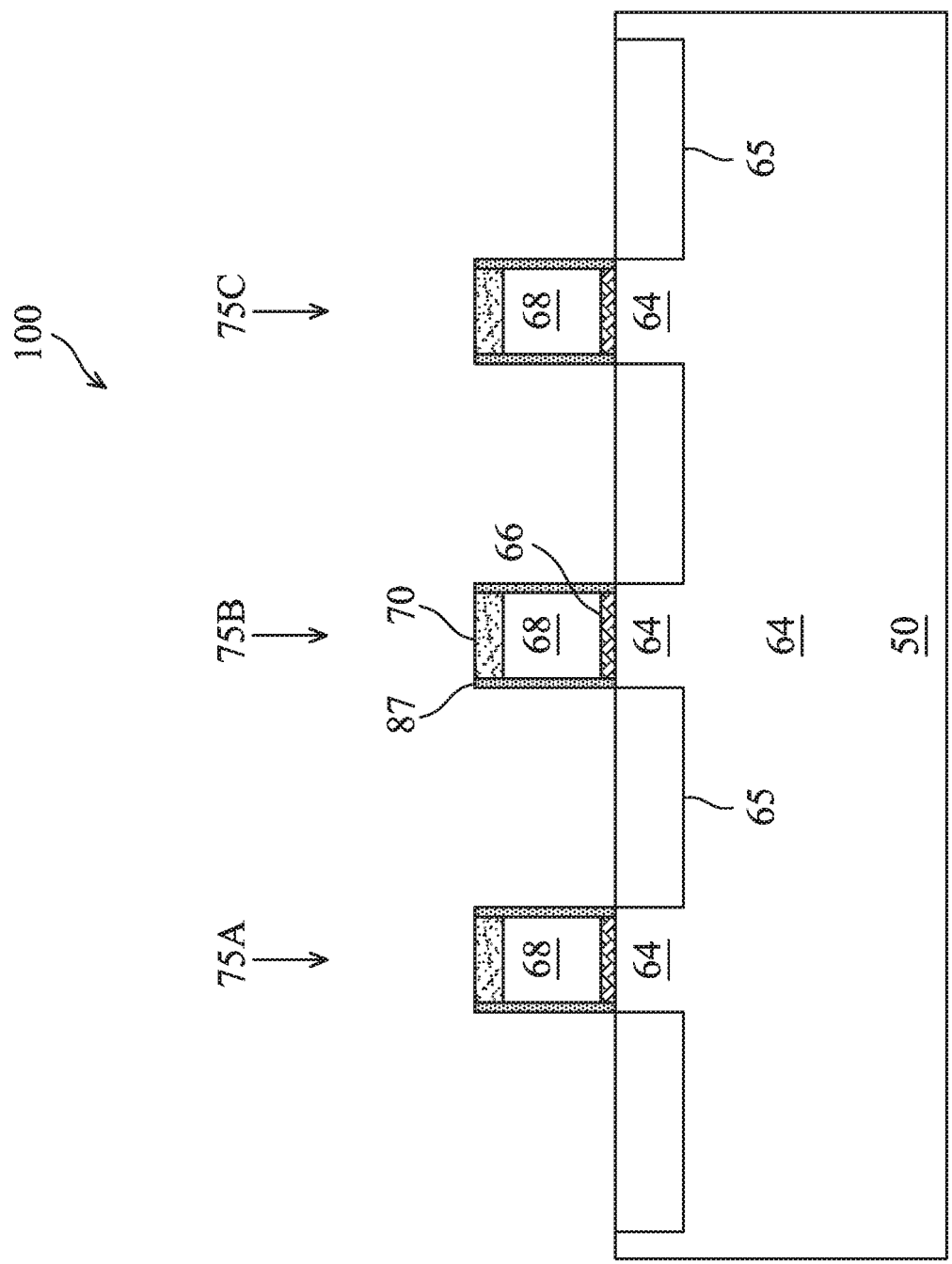

As illustrated in FIG. 6, lightly doped drain (LDD) regions 65 are formed in the fins 64. The LDD regions 65 may be formed by a plasma doping process. The plasma doping process may include forming and patterning masks such as a photoresist to cover the regions of the FinFET that are to be protected from the plasma doping process. The plasma doping process may implant N-type or P-type impurities in the fins 64 to form the LDD regions 65. For example, P-type impurities, such as boron, may be implanted in the fin 64 to form the LDD regions 65 for a P-type device. As another example, N-type impurities, such as phosphorus, may be implanted in the fin 64 to form the LDD regions 65 for an N-type device. In some embodiments, the LDD regions 65 abut the channel region of the FinFET device 100. Portions of the LDD regions 65 may extend under gate 68 and into the channel region of the FinFET device 100. FIG. 6 illustrates a non-limiting example of the LDD regions 65. Other configurations, shapes, and formation methods of the LDD regions 65 are also possible and are fully intended to be included within the scope of the present disclosure. For example, LDD regions 65 may be formed after gate spacers 87 are formed. In some embodiments, the LDD regions 65 are omitted. For simplicity, the LDD regions 65 are not illustrated in subsequent figures, with the understanding the LDD regions 65 may be formed in the fin 64.

Still referring to FIG. 6, after the LDD regions 65 are formed, a gate spacer 87 is formed on the gate structure. The gate spacer 87 may include a first gate spacer and a second gate spacer (not individually illustrated). For example, the first gate spacer may be a gate seal spacer and is formed on opposing sidewalls of the gate 68 and on opposing sidewalls of the gate dielectric 66. The second gate spacer is formed on the first gate spacer. The first gate spacer may be formed of a nitride, such as silicon nitride, silicon oxynitride, silicon carbide, silicon carbonitride, the like, or a combination thereof, and may be formed using, e.g., a thermal oxidation, CVD, or other suitable deposition process. The second gate spacer may be formed of silicon nitride, silicon carbonitride, a combination thereof, or the like using a suitable deposition method. The gate spacer 87 may have a thickness between about 20 nm and about 35 nm, as an example.

In an exemplary embodiment, the gate spacer is formed by first conformally depositing a first gate spacer layer over the FinFET device 100, then conformally depositing a second gate spacer layer over the deposited first gate spacer layer. Next, an anisotropic etch process, such as a dry etch process, is performed to remove a first portion of the second gate spacer layer disposed on upper surfaces of the FinFET device 100 (e.g., the upper surface of the mask 70) while keeping a second portion of the second gate spacer layer disposed along sidewalls of the gate structures. The second portion of the second gate spacer layer remaining after the anisotropic etch process forms the second gate spacer. The anisotropic etch process also removes a portion of the first gate spacer layer disposed outside of the sidewalls of the second gate spacer, and the remaining portion of the first gate spacer layer forms the first gate spacer.

The shapes and formation methods of the gate spacer 87 as illustrated in FIG. 6 are merely non-limiting examples, and other shapes and formation methods are possible. These and other variations are fully intended to be included within the scope of the present disclosure.

Figure 7:
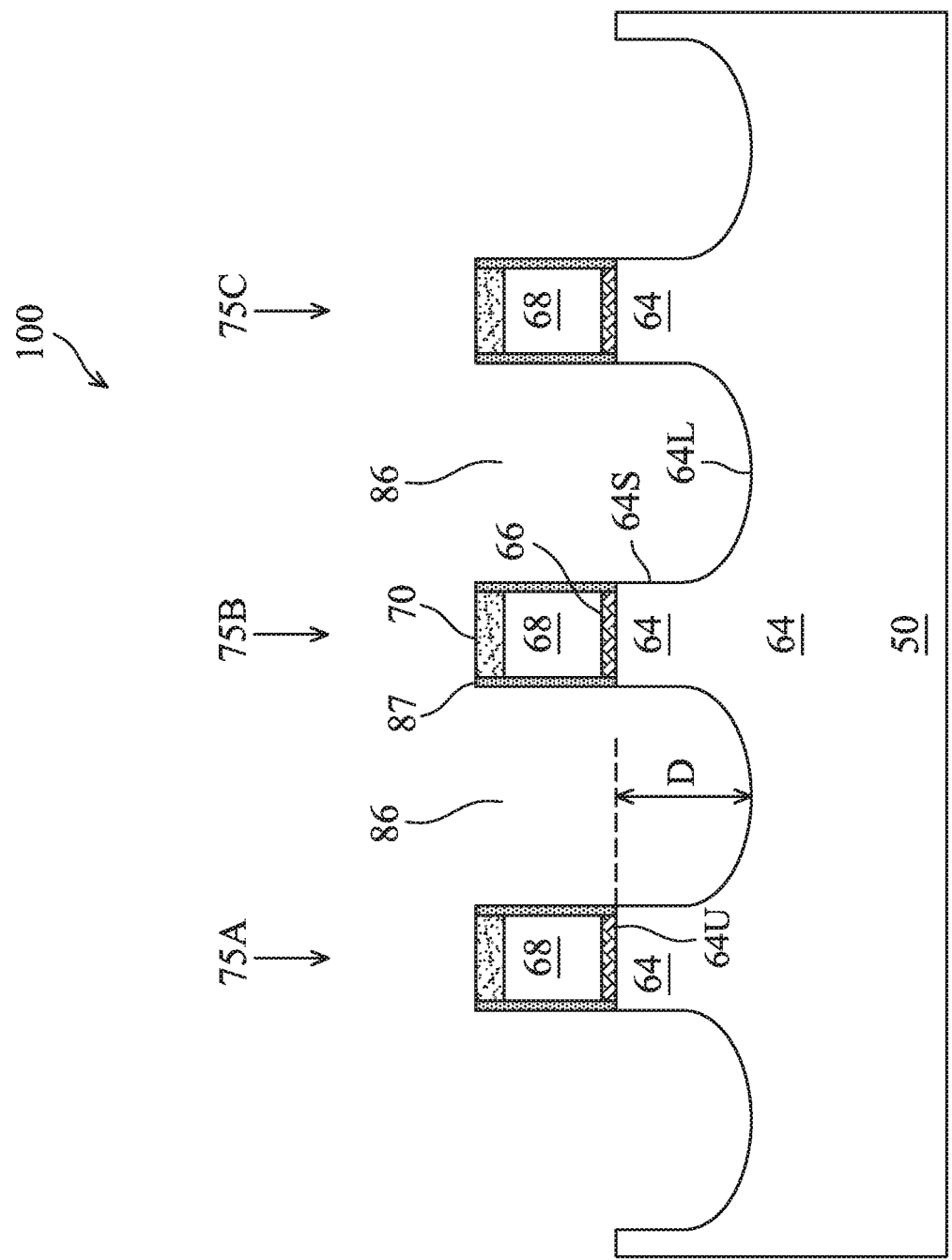

Next, as illustrated in FIG. 7, recesses 86 are formed in the fins 64 adjacent to the dummy gate structures 75, e.g., between adjacent dummy gate structures 75 and/or next to a dummy gate structure 75. The recesses 86 are formed by, e.g., an anisotropic etching process using the dummy gate structures 75 as an etching mask, in some embodiments, although any other suitable etching process may also be used. The recesses 86 expose sidewalls 64S and lower surfaces 64L of the fin 64, and therefore, the sidewalls 64S and the lower surfaces 64L may also be referred to as surfaces of the fin 64 exposed by the recesses 86. A depth D of the recess 86, measured between an upper surface 64U of the fin 64 and the lower surface 64L of the fin 64, may be between about 35 nm and about 60 nm.

Figure 8:
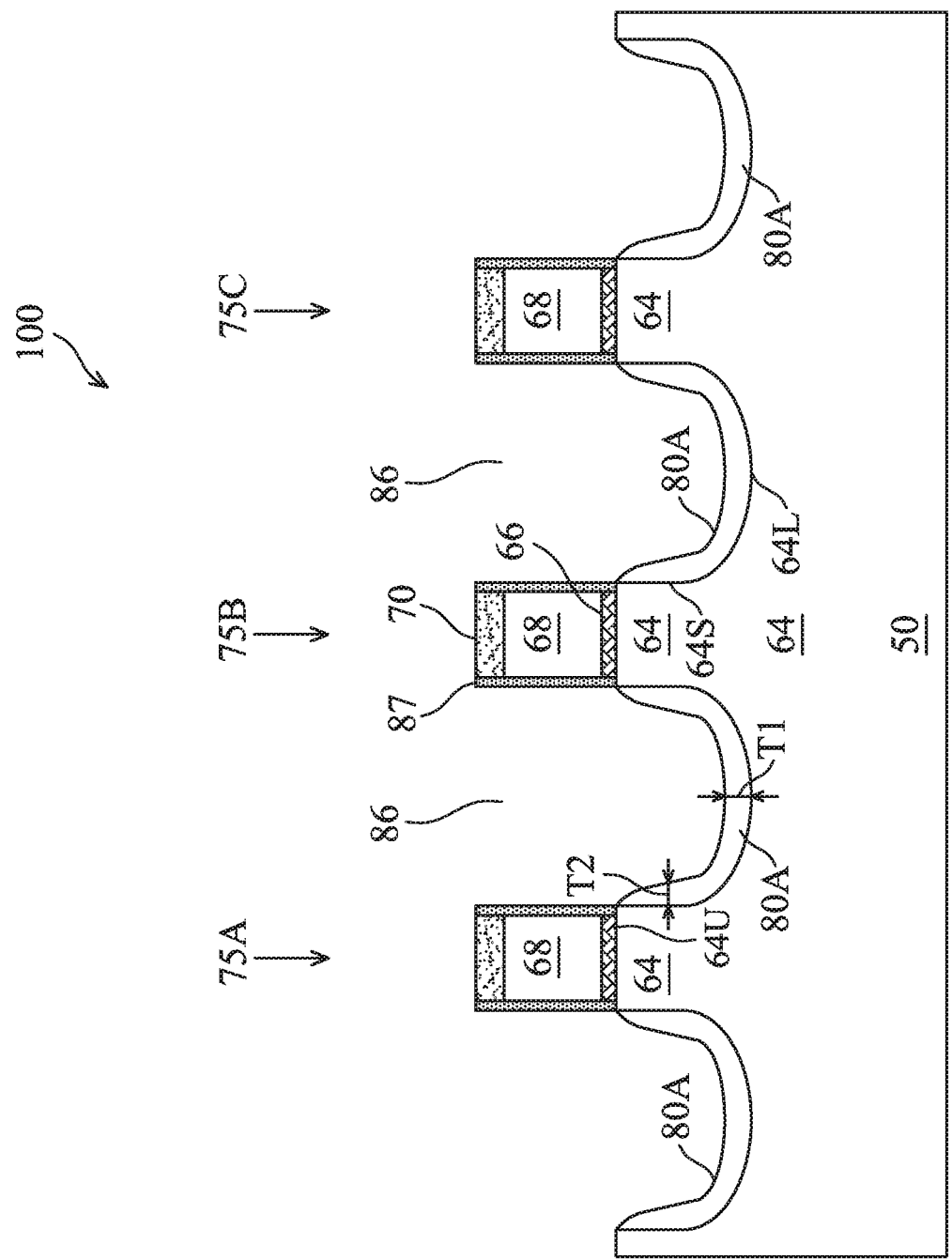

Next, as illustrated in FIG. 8, a layer 80A of source/drain regions 80 (see FIG. 10A) is formed in the recesses 86. The layer 80A comprises an epitaxial semiconductor material suitable for the type of device (e.g., N-type, or P-type) to be formed. In the illustrated embodiment, the FinFET device 100 is an N-type FinFET device, and the layer 80A comprises silicon phosphorous (SiP), silicon arsenic (SiAs), or the like. In the discussion herein, impurities such as phosphorous (P) and arsenic (As) are referred to as dopants in the epitaxial material of the source/drain regions 80.

As illustrated in FIG. 8, the layer 80A physically contacts and extends along sidewall 64S and lower surface 64L of the fin 64, and extends continuously from the upper surface 64U of the fin 64 to the lower surface 64L at the bottom of the recess 86. In the illustrated embodiment, the thickness of the layer 80A is non-uniform. In particular, bottom portions of the layer 80A (e.g., portions along the lower surface 64L of the fin 64) are thicker than sidewall portions of the layer 80A (e.g., portions along the sidewall 64S of the fin 64). For example, a thickness T1 of the bottom portion of the layer 80A is between about 1 nm and about 8 nm. A thickness T2 of the sidewall portion of the layer 80A is between about 1 nm and about 5 nm. A concentration of the dopant (e.g., P or As) in the layer 80A is between about $5e20/cm^3$ and about $2e21/cm^3$, in the illustrated embodiment.

In some embodiments, the layer 80A is formed by epitaxially growing a material in the recess 86, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof. The process conditions of the epitaxy process are adjusted to achieve a target dopant concentration, and/or to control the profile of the epitaxial material (e.g., layer 80A) formed.

In some embodiments, the epitaxy process is performed at a temperature between about 450° C. and about 800° C., and under a pressure between about 5 Torr and about 600 Torr. The epitaxy process is performed using process gases comprising a silicon-containing gas and a dopant gas. The silicon-containing gas may be silane ($SiH_4$), dichlorosilane (DCS), disilane (DS), trichlorosilane (TCS), combinations thereof, or the like. The dopant gas may be phosphine ($PH_3$), arsine ($AsH_3$), liquid arsine, combinations thereof, or the like. In some embodiments, besides the silicon-containing gas and the dopant gas, the process gases further include an etching gas, such as hydrogen chloride (HCl), to achieve selective epitaxy growth, such that after the epitaxy process is finished, the epitaxial material of the layer 80A is formed on semiconductor material (e.g., over the sidewalls 64S and the lower surfaces 64L of the fin 64) and not formed on, e.g., dielectric materials such as the gate spacers 87.

In some embodiments, during the epitaxy process to form the layer 80A, the flow rate of the silicon containing gas is between about 10 standard cubic centimeters per minute (sccm) and about 900 sccm, the flow rate of the dopant gas is between about 50 sccm and about 400 sccm, and the flow rate of the etching gas is between about 40 sccm and about 1000 sccm. The mixing ratio (e.g., ratio of the flow rates) of the different process gases (e.g., silicon-containing gas, dopant gas, and etching gas) are adjusted to achieve the target dopant concentration for the layer 80A. For example, the mixing ratio of the silicon-containing gas, the dopant gas, and the etching gas is about 7:2:1 in the epitaxy process to form the layer 80A, where the mixing ratio of 7:2:1 indicates that the flow rate of the silicon-containing gas is seven times that of the etching gas, and the flow rate of the dopant gas is twice that of the etching gas.

Figure 9:
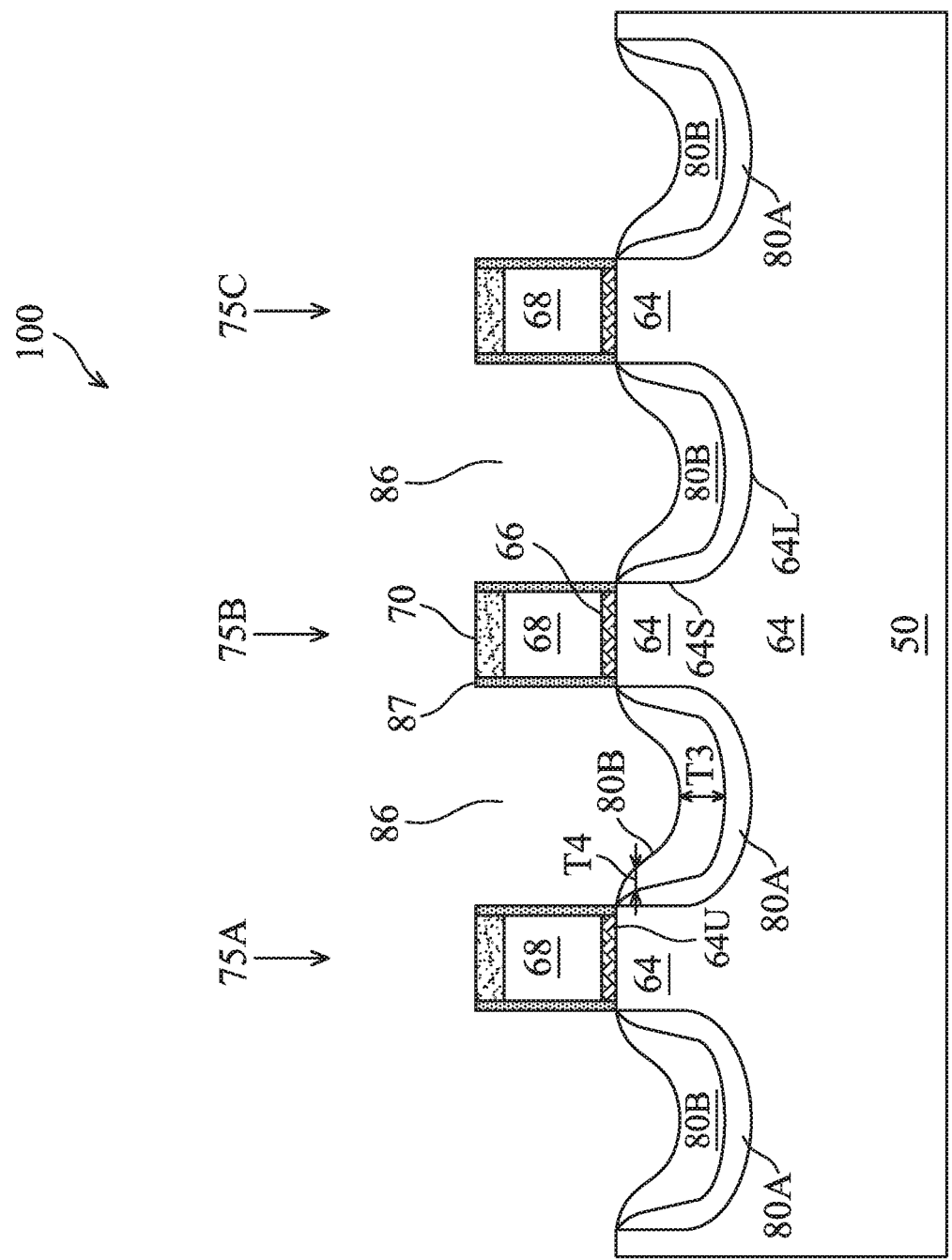

Next, as illustrated in FIG. 9, a layer 80B of the source/drain regions 80 (see FIG. 10A) is formed in the recesses 86 over the layer 80A. The layer 80B partially fills the recesses 86, and therefore, the recesses 86 are shallower after the layer 80B is formed. The layer 80B comprises a same epitaxial material (e.g., SiP, or SiAs) as the layer 80A, but with different (e.g., higher) dopant concentration. In addition, the profile (e.g., the dimension and/or the shape) of the layer 80B may be different from that of the layer 80A, as discussed hereinafter.

As illustrated in FIG. 9, the layer 80B physically contacts and extends along the layer 80A, and extends continuously from the upper surface 64U of the fin 64 to the bottoms of the (now shallower) recesses 86. In the illustrated embodiment, the thickness of the layer 80B is non-uniform. In particular, the layer 80B is thicker at the bottom portions than at the sidewalls portions. For example, a thickness T3 of the bottom portions of the layer 80B (e.g., portions at the bottom of the recesses 86) is between about 15 nm and about 48 nm. A thickness T4 of the sidewall portions of the layer 80B (e.g., portions along the sidewalls 64S) is between about 3 nm and about 30 nm. A concentration of the dopant (e.g., P or As) in the layer 80B is between about $2e21/cm^3$ and about $3.5e21/cm^3$, in the illustrated embodiment. In other words, the dopant concentration of the layer 80B is higher than that of the layer 80A.

In some embodiments, the layer 80B is formed by epitaxially growing a material over the layer 80A, e.g., using a same or similar epitaxy process as the layer 80A, but with the process conditions of the epitaxy process adjusted to achieve a target dopant concentration, and/or to control the profile of the epitaxial material (e.g., layer 80B) formed. For example, the epitaxy process to form the layer 80B may be performed in a same process chamber using the same process gases as the epitaxy process to form the layer 80A, but with process conditions, such as temperature of the process chamber, pressure of the process chamber, flow rates of the process gases, and/or the mixing ratio of process gases modified. In some embodiments, an epitaxy process is performed to form the layer 80A first (using process conditions chosen for the layer 80A), and once a target dimension (e.g., thickness) of the layer 80A is achieved, the process conditions of the epitaxy process are adjusted for the layer 80B, and the epitaxy process proceeds to form the layer 80B. Similarly, once a target dimension for the layer 80B is achieved, the process conditions of the epitaxy process are adjusted for a (subsequent formed) layer 80C (see FIG. 10A) of the source/drain regions 80, and the epitaxy process proceeds to form the layer 80C. Therefore, by adjusting the process conditions at different stages of the epitaxy process, the same epitaxy process may be used to form the layers 80A, 80B, and 80C successively in a same process chamber. In other words, the epitaxy process to form the layer 80A, the epitaxy process to form the layer 80B, and the epitaxy process to form the layer 80C may be three different stages of a single (continuous) epitaxy process, with each stage having different process conditions.

In some embodiments, the epitaxy process to form the layer 80B is performed at a temperature between about 400° C. and about 800° C., and under a pressure between about 5 Torr and about 600 Torr. The epitaxy process is performed using a silicon-containing gas and a dopant gas. The silicon-containing gas may be silane ($SiH_4$), dichlorosilane (DCS), disilane (DS), trichlorosilane (TCS), combinations thereof, or the like. The dopant gas may be phosphine ($PH_3$), arsine ($AsH_3$), liquid arsine, combinations thereof, or the like. In some embodiments, an etching gas, such as hydrogen chloride (HCl), is used in addition to the silicon-containing gas and the dopant gas in the epitaxy process to achieve selective epitaxy growth. The silicon-containing gas, the dopant gas, and the etching gas are the same as the respective process gases used in the epitaxy process to form the layer 80A, in the illustrated embodiment.

In some embodiments, during the epitaxy process to form the layer 80B, the flow rate of the silicon containing gas is between about 10 sccm and about 900 sccm, the flow rate of the dopant gas is between about 50 sccm and about 400 sccm, and the flow rate of the etching gas is between about 40 sccm and about 1000 sccm. The mixing ratio of the different process gases are adjusted to achieve the target dopant centration for the layer 80B. In an embodiment, the mixing ratio of the silicon-containing gas, the dopant gas, and the etching gas is about 11:3:1 in the epitaxy process to form the layer 80B.

Figure 10A:
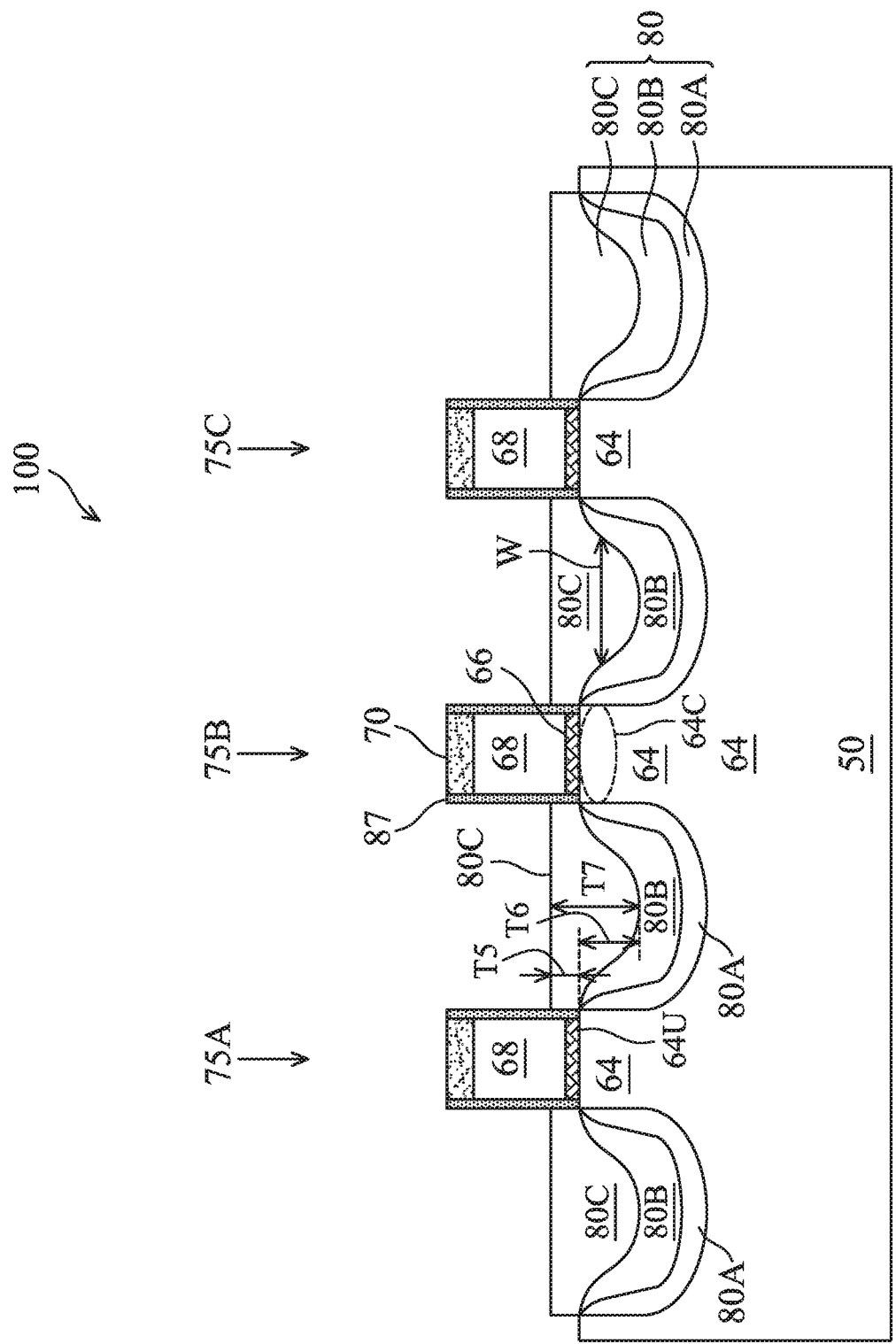
Figure 10B:
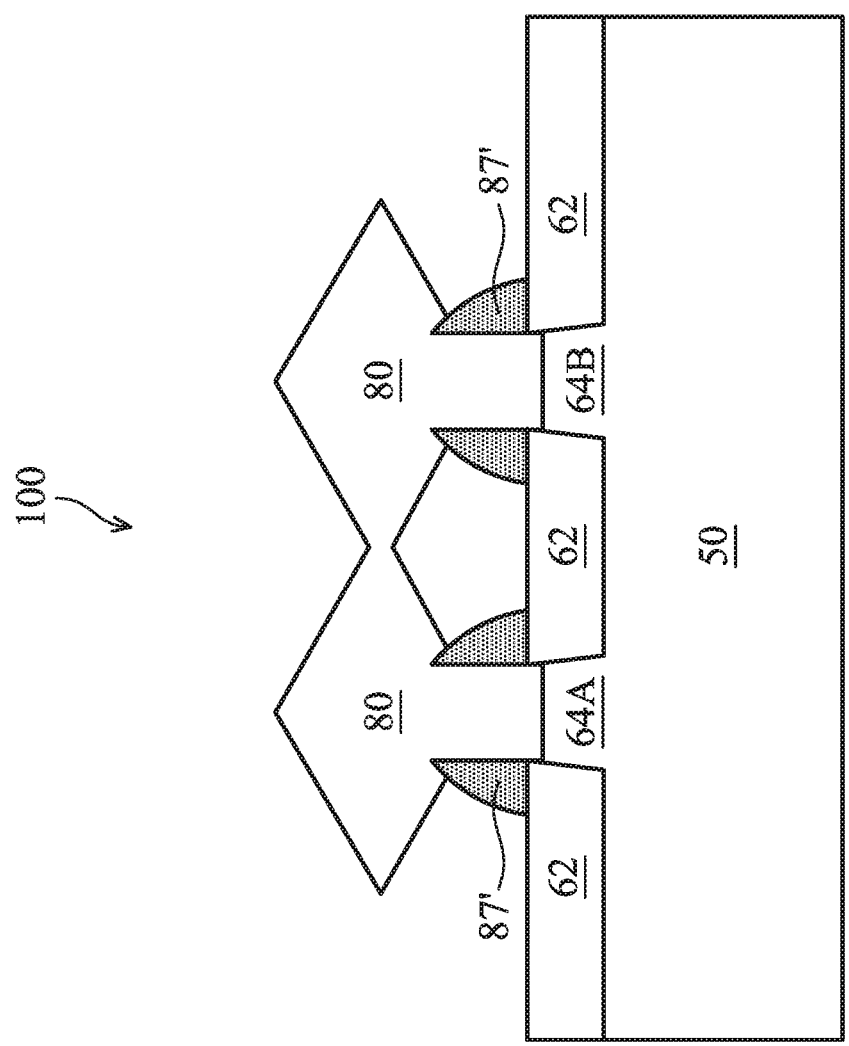
Figure 10C:
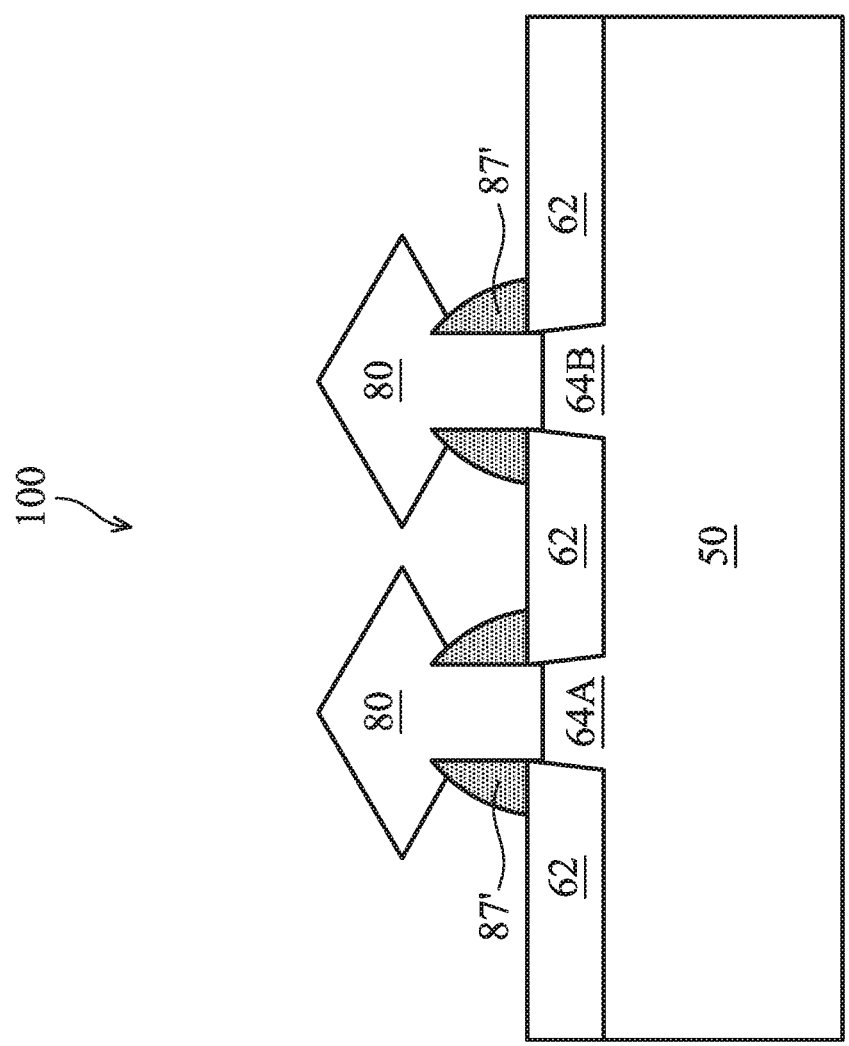

Next, as illustrated in FIG. 10A, a layer 80C of the source/drain regions 80 is formed over the layer 80B. The layer 80C fills the recesses 86 and extends above the upper surface 64U of the fin 64. The layer 80C comprises a same epitaxial material (e.g., SiP, or SiAs) as the layers 80A and 80B, but with different (e.g., higher) dopant concentration. In addition, the profile (e.g., the dimension and/or the shape) of the layer 80C may be different from that of the layers 80A and 80B, as discussed hereinafter. In the illustrated embodiment, the layers 80A, 80B, and 80C form the source/drain regions 80 of the FinFET device 100.

As illustrated in FIG. 10A, the layer 80C has a lower portion extending below the upper surface 64U of the fin 64 by a distance T6. In an embodiment, the distance T6, measured between a lowermost surface of the layer 80C and the upper surface 64U of the fin 64, is between about 5 nm and about 10 nm. In addition, the layer 80C has an upper portion extending above the upper surface 64U of the fin 64 by a distance T5. The upper portion of the layer 80C may physically contact the gate spacers 87 adjacent to the layer 80C. In an embodiment, the distance T5, measured between an upper surface (e.g., an uppermost surface) of the layer 80C and the upper surface 64U of the fin 64, is between about 3 nm and about 5 nm. A thickness T7 of the layer 80C, measured between the upper surface of the layer 80C and the lowermost surface of the layer 80C, is between about 5 nm and about 15 nm, in some embodiments. In the example of FIG. 10A, the upper portions of the layer 80C has a rectangular cross-section, and the cross-section of the lower portion of the layer 80C has a tapering profile, with a distance W between opposing sidewalls of the lower portion decreasing as the lower portion extends toward the substrate 50. Other profiles for the layer 80C are also possible and are fully intended to be included within the scope of the present disclosure. A concentration of the dopant (e.g., P or As) in the layer 80C is between about $3.5e21/cm^3$ and about $5e21/cm^3$, in the illustrated embodiment. In other words, the dopant concentration of the layer 80C is higher than that of the layer 80B, and the dopant concentration of the layer 80B is higher than that of the layer 80A.

In some embodiments, the layer 80C is formed by epitaxially growing a material over the layer 80B, e.g., using a same or similar epitaxy process as the layers 80A and 80B, but with the process conditions of the epitaxy process adjusted to achieve a target dopant concentration, and/or to control the profile of the epitaxial material (e.g., layer 80C) formed, as discussed above.

In some embodiments, the epitaxy process to form the layer 80C is performed at a temperature between about 400° C. and about 800° C., and under a pressure between about 5 Torr and about 650 Torr. The epitaxy process is performed using a silicon-containing gas and a dopant gas. The silicon-containing gas may be silane ($SiH_4$), dichlorosilane (DCS), disilane (DS), trichlorosilane (TCS), combinations thereof, or the like. The dopant gas may be phosphine ($PH_3$), arsine ($AsH_3$), liquid arsine, combinations thereof, or the like. In some embodiments, an etching gas, such as hydrogen chloride (HCl), is used in addition to the silicon-containing gas and the dopant gas in the epitaxy process to achieve selective epitaxy growth. The silicon-containing gas, the dopant gas, and the etching gas are the same as the respective process gases used in the epitaxy process to form the layer 80A, in the illustrated embodiment.

In some embodiments, during the epitaxy process to form the layer 80C, the flow rate of the silicon containing gas is between about 10 sccm and about 900 sccm, the flow rate of the dopant gas is between about 50 sccm and about 400 sccm, and the flow rate of the etching gas is between about 40 sccm and about 1000 sccm. The mixing ratio of the different process gases are adjusted to achieve the target dopant centration for the layer 80C. In an embodiment, the mixing ratio of the silicon-containing gas, the dopant gas, and the etching gas is about 15:6:1 in the epitaxy process to form the layer 80C.

As illustrated in FIG. 10B, the epitaxial source/drain regions 80 (e.g., 80A, 80B, and 80C, not individually illustrated) may have surfaces raised from respective surfaces of the fins 64 (e.g. raised above the non-recessed portions of the fins 64) and may have facets. The source/drain regions 80 of the adjacent fins 64 may merge to form a continuous epitaxial source/drain region 80. FIG. 10B also illustrates spacers 87' on opposing sidewalls of the source/drain regions 80, which spacers 87' may have a same or similar structure as gate spacers 87 (see FIG. 10A) and may be formed in a same processing step with the gate spacers 87. In some embodiments, the source/drain regions 80 of adjacent fins 64 do not merge together and remain separate source/drain regions 80 (see FIG. 10C).

After the epitaxial source/drain regions 80 are formed, an optional implantation process may be performed to implant dopant into the source/drain regions 80. In the illustrated embodiment, the implantation process is omitted, since the dopant concentrations of the layers (e.g., 80A, 80B, 80C) of the source/drain regions 80 are within the respective target dopant concentration ranges after the source/drain regions 80 are formed using the processing steps described above. Next, an anneal process is performed to activate the dopant in the source/drain regions 80.

The presently disclosed multi-layered source/drain regions 80 and the multi-step formation method as illustrated in FIGS. 8, 9, and 10A provide many advantages. The layer 80C has a high concentration of dopant (e.g., P or As) between about $3.5e21/cm^3$ and about $5e21/cm^3$, which may be orders of magnitude (e.g., ten times, a hundred times, or more) larger than the dopant concentration in source/drain regions of previous transistor devices. Previously, without the present disclosure, source/drain regions with such high dopant concentration (e.g., between $3.5e21/cm^3$ and about $5e21/cm^3$) may suffer from lower activation rate, and selective epitaxy growth of the source/drain regions 80 may be difficult to achieve with such high dopant concentration. Therefore, the high concentration of dopant (e.g., between about $3.5e21/cm^3$ and about $5e21/cm^3$) in source/drain regions may not be achievable or practical without the present disclosure. The source/drain regions 80 of the present disclosure, however, have high activation rate and excellent selective epitaxy growth property due to the structure of the source/drain regions 80 and the formation method used to form the source/drain regions 80. The high activation rate is indicated (e.g., reflected) by the increased carrier mobility of the presently disclosed source/drain regions 80. For example, the carrier mobility of the source/drain regions 80 comprising SiP may between about 50 $cm^2/(V\ S)$ and about 70 cm²/(V S) before the anneal process, and after the anneal process, the carrier mobility of the source/drain regions 80 may be between 55 cm²/(V S) and about 80 cm²/(V S). Therefore, the present disclosure allows source/drain regions 80 with high dopant concentration, high activation rate, and selective epitaxy growth property to be formed, which improves the performance of the FinFET device 100.

In addition, since the lower portion of the layer 80C extends below the upper surface 64U of the fin 64 (see FIG. 10A), during the anneal process to active the dopant in the source/drain regions 80, some of the dopant (e.g., P or As) is driven into the channel region 64C (see FIG. 10A), thereby advantageously reducing the channel resistance $R_{ch}$ of the FinFET device 100. For example, a reduction in $R_{ch}$ between about 0.13 KΩ and 0.15 KΩ has been achieved. Recall that each of the layers 80A and 80B has a non-uniform thickness, with the sidewall portions being thinner than the bottom portions. The thinner sidewall portions may advantageously facilitate the thermal drive-in of the dopant from the layer 80C into the channel region 64C. Note that while the thermal drive-in of the dopant into the channel region may reduce the channel resistance $R_{ch}$, the leakage current of the FinFET device 100 may be adversely affected by the thermal drive-in, if it is not addressed properly. This may be another reason why previous transistor devices may not use such a high dopant concentration in the source/drain region, and why previous transistor devices may not have a portion of the source/drain region with high dopant concentration extending so deep (e.g., 5 nm to 10 nm) below the upper surface 64U of the fin 64. The presently disclosed source/drain regions 80, with its structure and formation methods, minimizes or reduces the performance penalty due to thermal drive-in of the dopant into channel region, such that the performance penalty is negligible. For example, it has been demonstrated that the drain-induced barrier lowering (DIBL) caused by the thermal drive-in is merely 2 mV. Therefore, the presently disclosed FinFET device 100 reduces the channel resistance $R_{ch}$ with negligible performance penalty.

Furthermore, the upper portion of the layer 80C, which extends above the upper surface 64U of the fin 64, increases the volume of the epitaxial source/drain region 80. The increased volume of the layer 80C, together with the lower energy barrier between subsequently formed source/drain contacts (see 102B in FIG. 14A) and the layer 80C (due to the high dopant concentration of the layer 80C), advantageously reduces the contact resistance $R_p$ of the FinFET device 100 formed.

Figure 11A:
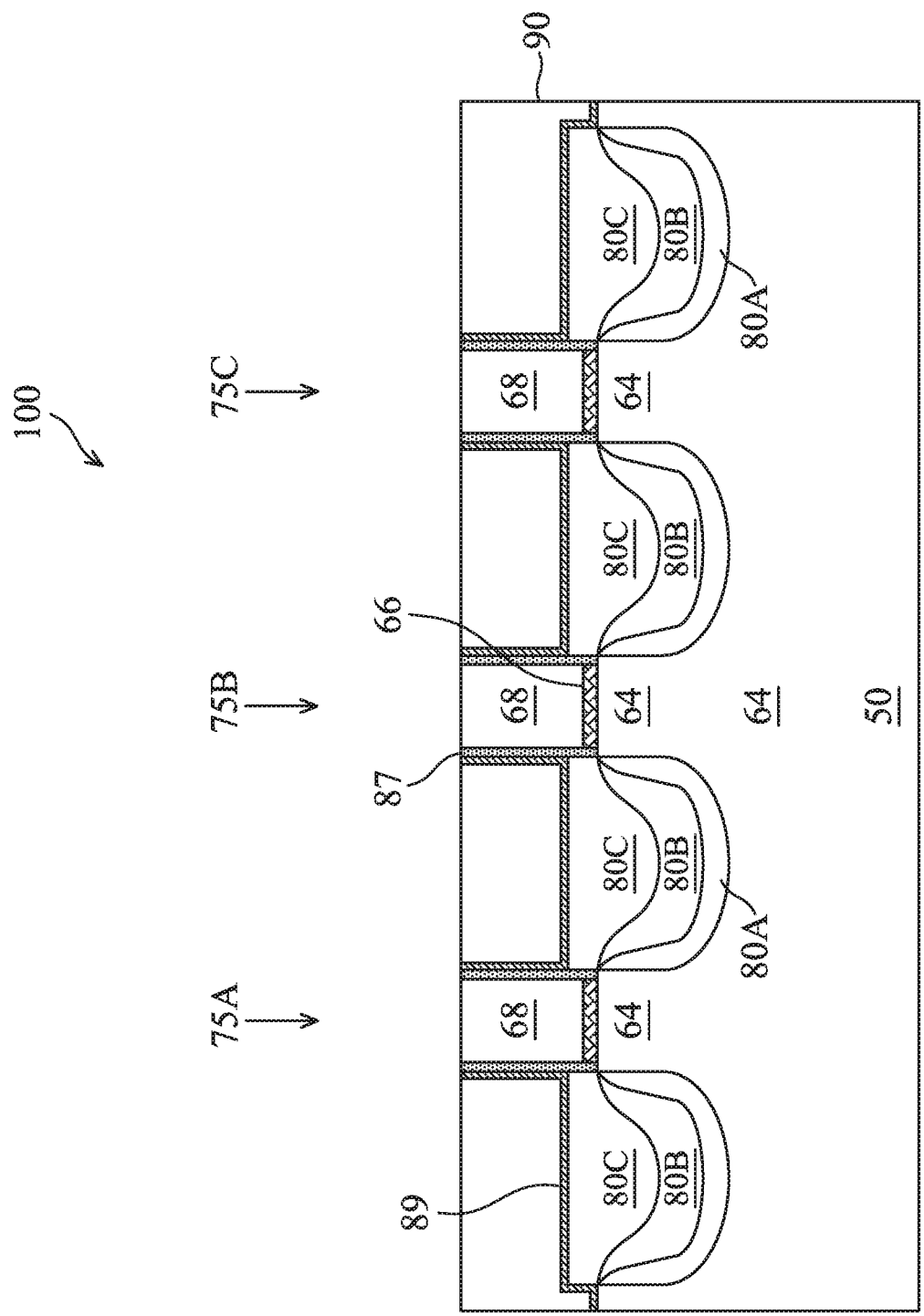
Figure 11B:
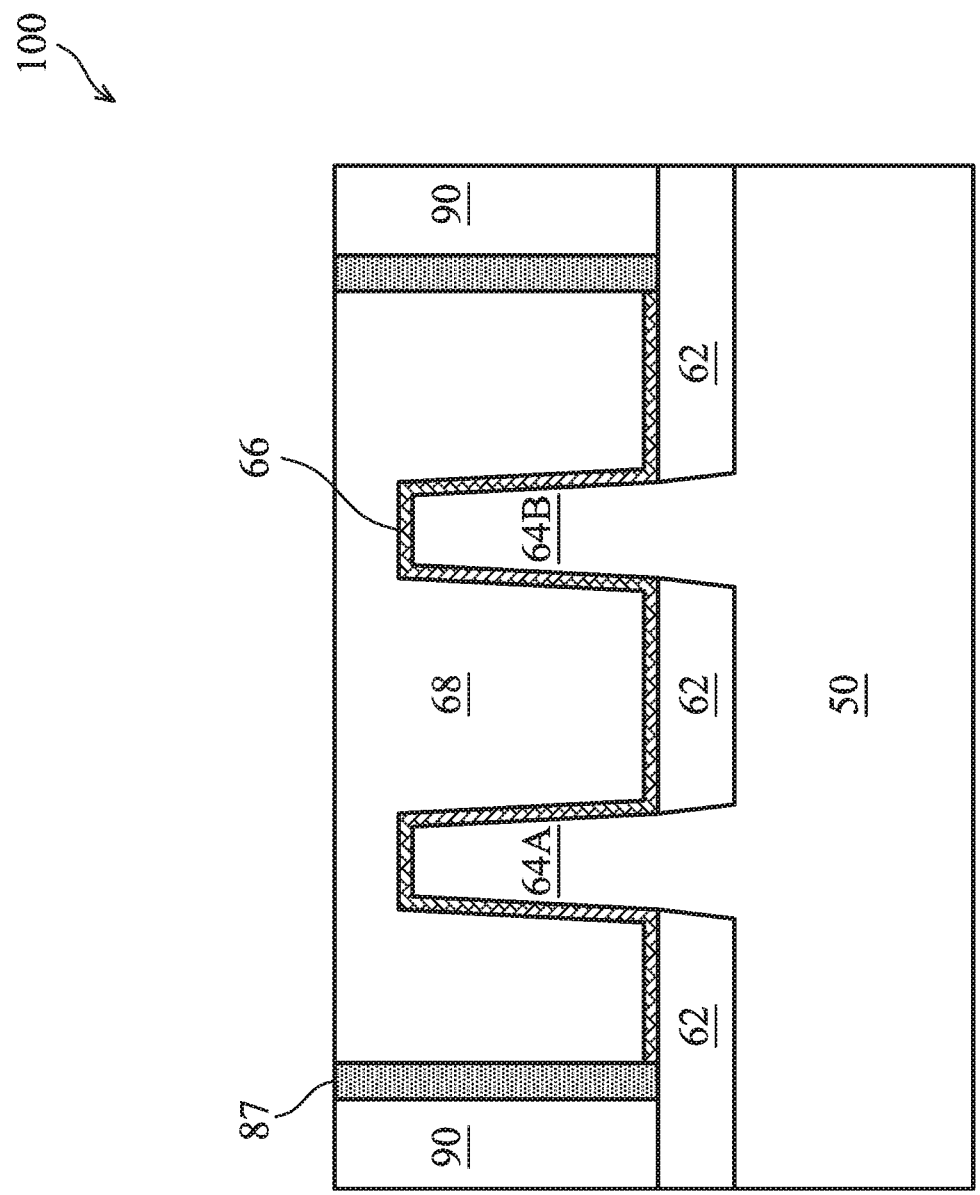

Next, as illustrated in FIG. 11A, a contact etch stop layer (CESL) 89 is formed over the structure illustrated in FIG. 10A. The CESL 89 functions as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, a first interlayer dielectric (ILD) 90 is formed over the CESL 89 and over the dummy gate structures 75 (e.g., 75A, 75B, and 75C). In some embodiments, the first ILD 90 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to remove the mask 70 and to remove portions of the CESL 89 disposed over the gate 68. After the planarization process, the top surface of the first ILD 90 is level with the top surface of the gate 68.

FIG. 11B illustrates the cross-sectional view of the FinFET device 100 shown in FIG. 11A, but along cross-section B-B. As illustrated in FIG. 11B, the gate 68 is disposed over the fin 64A and the fin 64B, and extends continuously from the fin 64A to the fin 64B. The gate spacers 87 are formed between the gate 68 and the first ILD 90. An embodiment gate-last process (sometimes referred to as replacement gate process) is performed subsequently to replace the gate 68 and the gate dielectric 66 with an active gate (may also be referred to as a replacement gate or a metal gate) and active gate dielectric material(s). The active gate may be a metal gate, in some embodiments. Therefore, the gate 68 and the gate dielectric 66 are considered dummy gate structures in a gate-last process.

Figure 12:
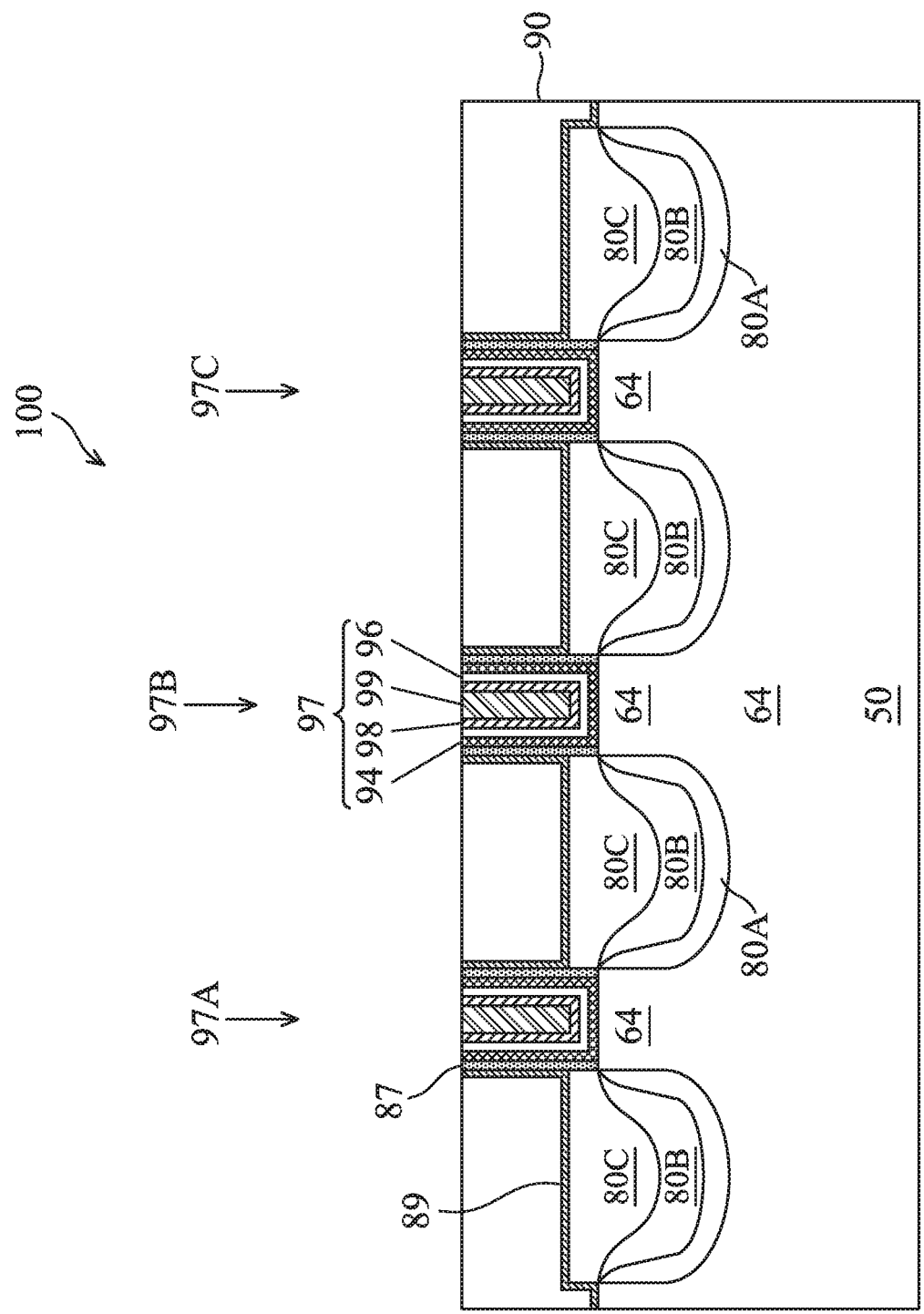
Figure 13:
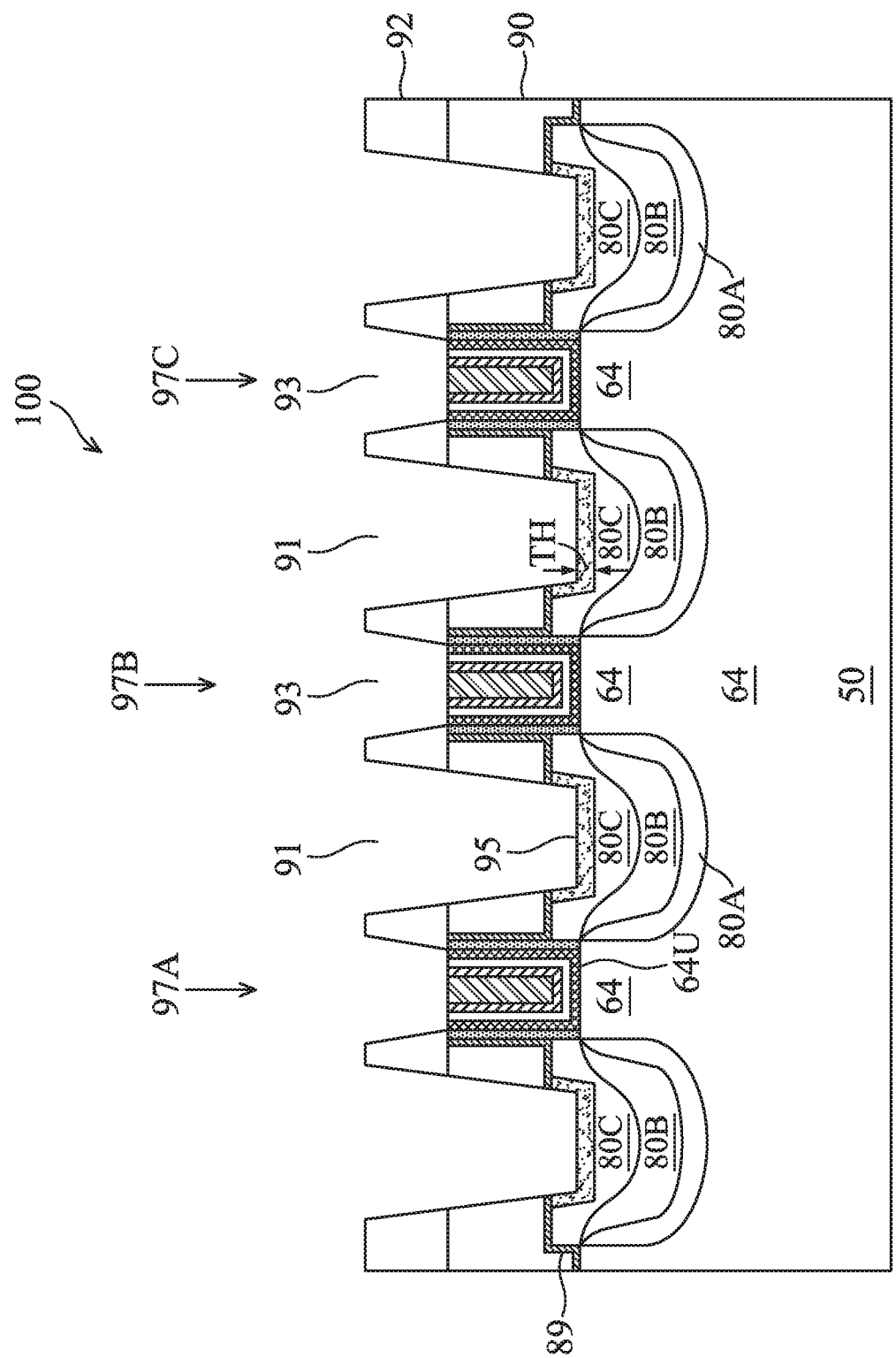
Figure 14A:
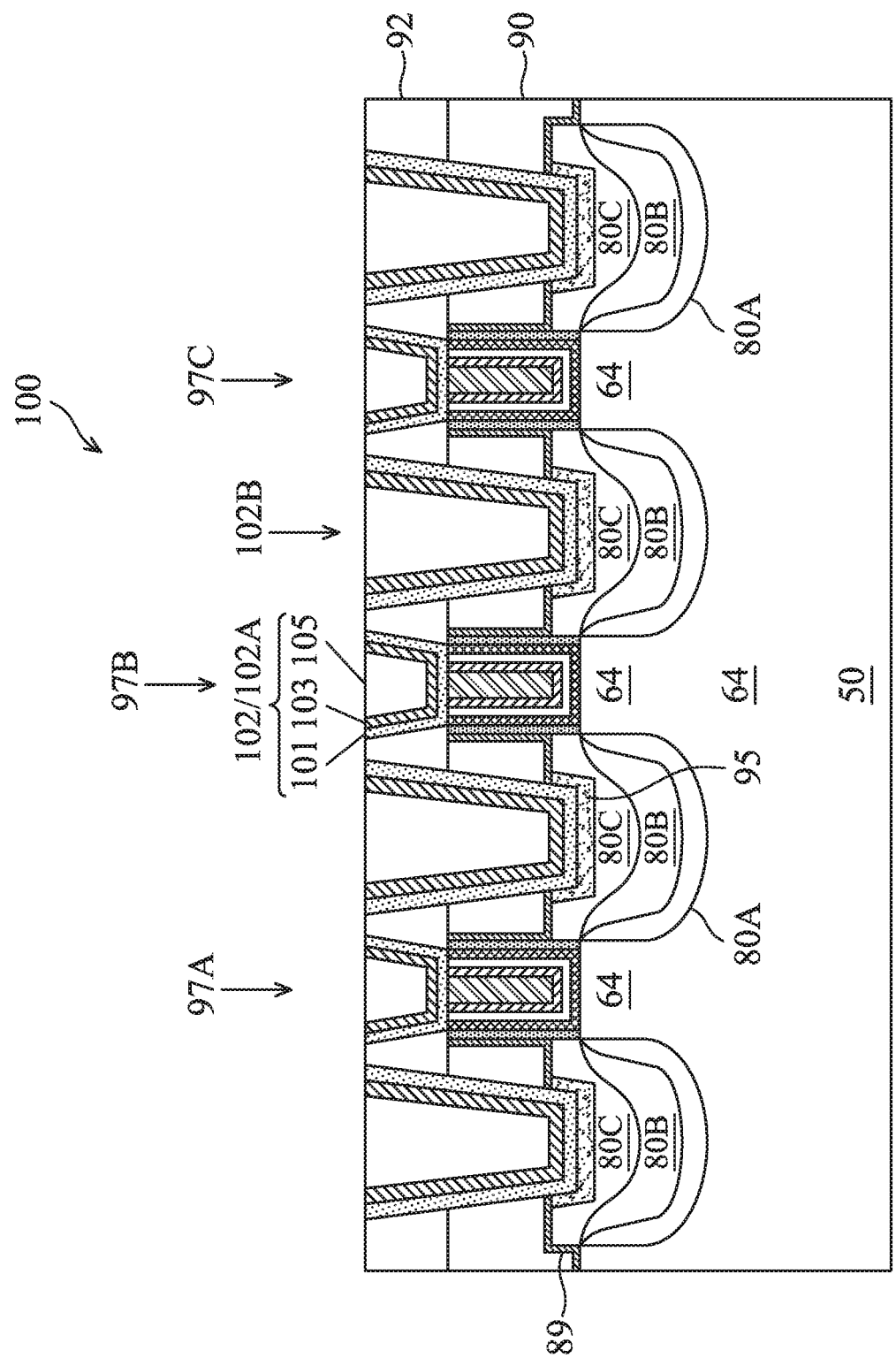
Figure 14B:
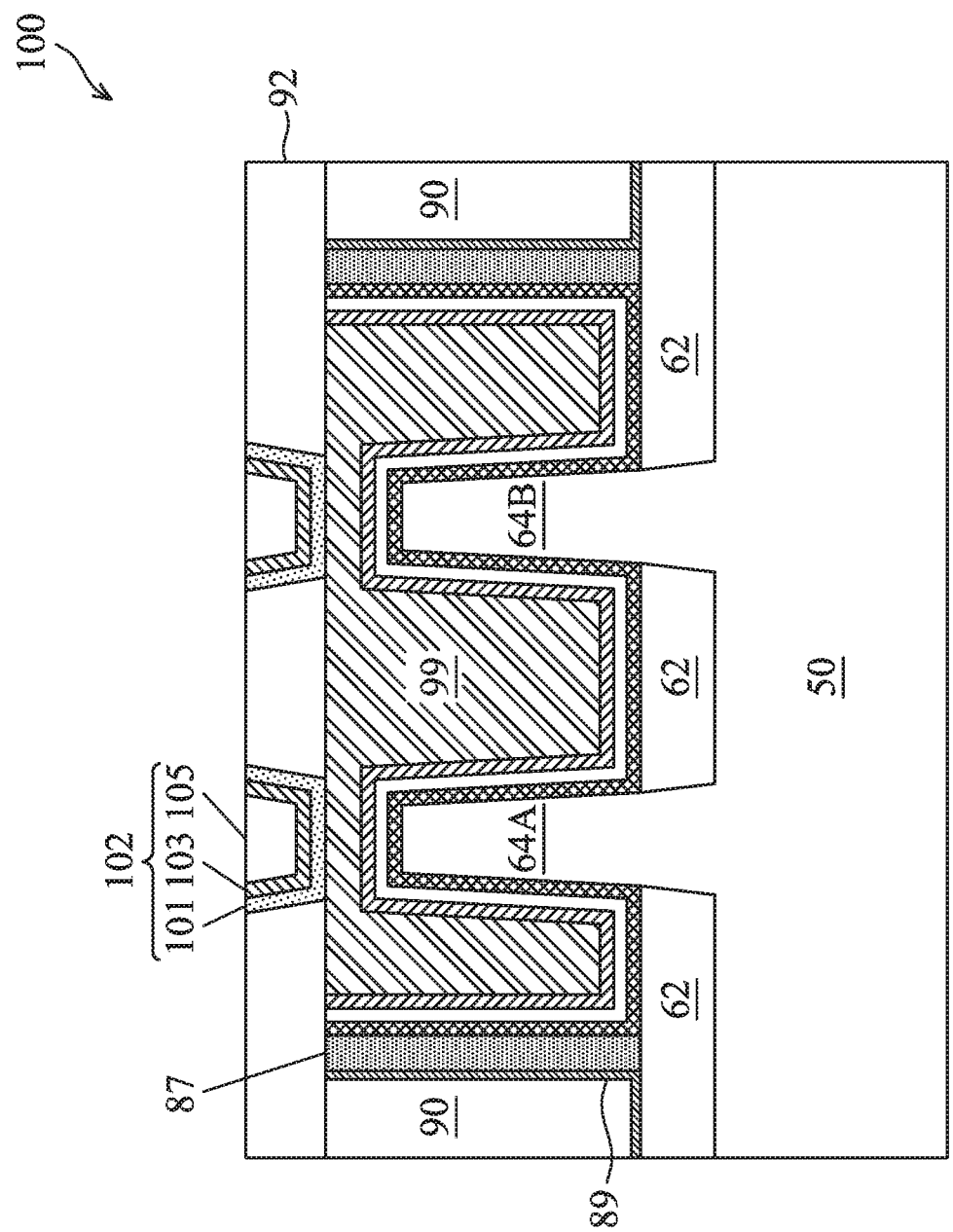

FIGS. 12, 13, and 14A illustrate cross-sectional views of the FinFET device 100 along cross-section A-A during further processing, in accordance with some embodiments. Referring to FIG. 12, the dummy gate structures 75A, 75B, and 75C are replaced by active gate structures 97A, 97B, and 97C, respectively. In accordance with some embodiments, to form the active gate structures 97 (e.g., 97A, 97B, or 97C), the gate 68 and the gate dielectric 66 directly under the gate 68 are removed in an etching step(s), so that recesses (not shown) are formed between the gate spacers 87. Each recess exposes the channel region of a respective fin 64. During the dummy gate removal, the dummy gate dielectric layer 66 may be used as an etch stop layer when the dummy gate 68 is etched. The dummy gate dielectric layer 66 may then be removed after the removal of the dummy gate 68.

Next, a gate dielectric layer 94, a barrier layer 96, a seed layer 98, and a gate electrode 99 are formed in the recesses for the replacement gates 97. The gate dielectric layer 94 is deposited conformally in the recesses, such as on the top surfaces and the sidewalls of the fins 64 and on sidewalls of the gate spacers 87, and on a top surface of the first ILD 90 (not shown). In accordance with some embodiments, the gate dielectric layer 94 comprises silicon oxide, silicon nitride, or multilayers thereof. In other embodiments, the gate dielectric layer 94 includes a high-k dielectric material, and in these embodiments, the gate dielectric layers 94 may have a k value greater than about 7.0, and may include a metal oxide or a silicate of Hf, Al, Zr, La, Mg, Ba, Ti, Pb, and combinations thereof. The formation methods of gate dielectric layer 94 may include molecular beam deposition (MBD), atomic layer deposition (ALD), PECVD, and the like.

Next, the barrier layer 96 is formed conformally over the gate dielectric layer 94. The barrier layer 96 may comprise an electrically conductive material such as titanium nitride, although other materials, such as tantalum nitride, titanium, tantalum, or the like, may alternatively be utilized. The barrier layer 96 may be formed using a CVD process, such as PECVD. However, other alternative processes, such as sputtering, metal organic chemical vapor deposition (MOCVD), or ALD, may alternatively be used.

Although not illustrated in FIG. 12, work function layers such as P-type work function layer or N-type work function layer may be formed in the recesses over the barrier layers 96 and before the seed layer 98 is formed, in some embodiments. Exemplary P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Exemplary N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), and/or other suitable process.

Next, the seed layer 98 is formed conformally over the barrier layer 96. The seed layer 98 may include copper, titanium, tantalum, titanium nitride, tantalum nitride, the like, or a combination thereof, and may be deposited by ALD, sputtering, PVD, or the like. In some embodiments, the seed layer is a metal layer, which may be a single layer or a composite layer comprising a plurality of sub-layers formed of different materials. For example, the seed layer 98 comprises a titanium layer and a copper layer over the titanium layer.

Next, the gate electrode 99 is deposited over the seed layer 98, and fills the remaining portions of the recesses. The gate electrode 99 may be made of a metal-containing material such as Cu, Al, W, the like, combinations thereof, or multi-layers thereof, and may be formed by, e.g., electroplating, electroless plating, or other suitable method. After the formation of the gate electrode 99, a planarization process, such as a CMP, may be performed to remove the excess portions of the gate dielectric layer 94, the barrier layer 96, the work function layer (if formed), the seed layer 98, and the gate electrode 99, which excess portions are over the top surface of the first ILD 90. The resulting remaining portions of the gate dielectric layer 94, the barrier layer 96, the work function layer (if formed), the seed layer 98, and the gate electrode 99 thus form the replacement gates 97 of the resulting FinFET device 100.

Referring next to FIG. 13, a second ILD 92 is formed over the first ILD 90. Contact openings 93 are formed through the second ILD 92 to expose the replacement gates 97 (e.g., 97A, 97B, and 97C). Similarly, contact openings 91 are formed through the first ILD 90 and the second ILD 92 to expose the source/drain regions 80.

In an embodiment, the second ILD 92 is a flowable film formed by a flowable CVD method. In some embodiments, the second ILD 92 is formed of a dielectric material such as PSG, BSG, BPSG, USG, or the like, and may be deposited by any suitable method, such as CVD and PECVD. The contact openings 91 and 93 may be formed using photolithography and etching. The etching process etches through the CESL 89 to expose the layer 80C of the source/drain regions 80. The etching process may over-etch, and therefore, the contact openings 91 may extends into the layer 80C, and a bottom of the contact opening 91 may be level with (e.g., at a same level, or having a same distance from the substrate), or lower than (e.g., closer to the substrate), the upper surface 64U of the fin 64.

Since the layer 80C extends above the upper surface 64U of the fin 64, even with over-etching by the etching process to remove the CESL 89, the remaining portion of the layer 80C still have a large volume for connection with the source/drain contact (see, e.g., 102B in FIG. 14A) formed subsequently, which helps to reduce the contact resistance $R_p$ of the FinFET device 100. If the upper portion of the layer 80C does not extends above the upper surface 64U of the fin 64, the volume of the remaining portion of the layer 80C after the over-etching may be too small, and the contact resistance $R_p$ of the FinFET device 100 may be increased.

The tolerance to over-etching of the CESL 89 illustrates another advantage of the present disclosure.

After the contact openings 93 are formed, silicide regions 95 are formed over the layer 80C. In some embodiments, the silicide regions 95 are by first depositing a metal capable of reacting with semiconductor materials (e.g., silicon, germanium) to form silicide or germanide regions, such as nickel, cobalt, titanium, tantalum, platinum, tungsten, other noble metals, other refractory metals, rare earth metals or their alloys, over the exposed portions of the layer 80C of the epitaxial source/drain regions 80, then performing a thermal anneal process to form the silicide regions 95. The un-reacted portions of the deposited metal are then removed, e.g., by an etching process. Although regions 95 are referred to as silicide regions, regions 95 may also be germanide regions, or silicon germanide regions (e.g., regions comprising silicide and germanide). In an embodiment, the silicide region 95 comprises TiSi, and has a thickness TH between about 2 nm and about 10 nm.

Next, in FIG. 14A, contacts 102 (e.g., 102A, 102B, may also be referred to as contact plugs) are formed in the contact openings 91 and 93. Each of the contacts 102 includes a barrier layer 101, a seed layer 103, and a conductive material 105, and is electrically coupled to the underlying conductive feature (e.g., replacement gate 97, or silicide region 95), in the illustrated embodiment. The contacts 102A that are electrically coupled to the replacement gates 97 may be referred to as gate contacts, and the contacts 102B that are electrically coupled to the silicide regions 95 may be referred to as source/drain contacts. The materials and the formation methods for the barrier layers 101, the seed layer 103 and the conductive material 105 may be the same as or similar to those discussed above for the barrier layers 96, the seed layer 98, and the gate electrode 99 of the replacement gate 97, respectively, thus details are not repeated. In an embodiment, the conductive material 105 of the source/drain contact 102B is tungsten (W), and a height of the source/drain contact 102B is between about 5 nm and about 15 nm. In FIG. 14A, all of the contacts 102 are illustrated in a same cross-section for illustration purpose. This is, of course, an example and not limiting. The contacts 102 may be in different cross-sections.

FIG. 14B illustrates the FinFET device 100 of FIG. 14A, but along cross-section B-B. FIG. 14B illustrates a contact 102 over each of the fins 64A and 64B. The contacts 102 are electrically coupled to the replacement gate 97. The number and the locations of the contacts 102 are for illustration purpose only and not limiting, other numbers and other locations are also possible and are fully intended to be included within the scope of the present disclosure.

Figure 15:
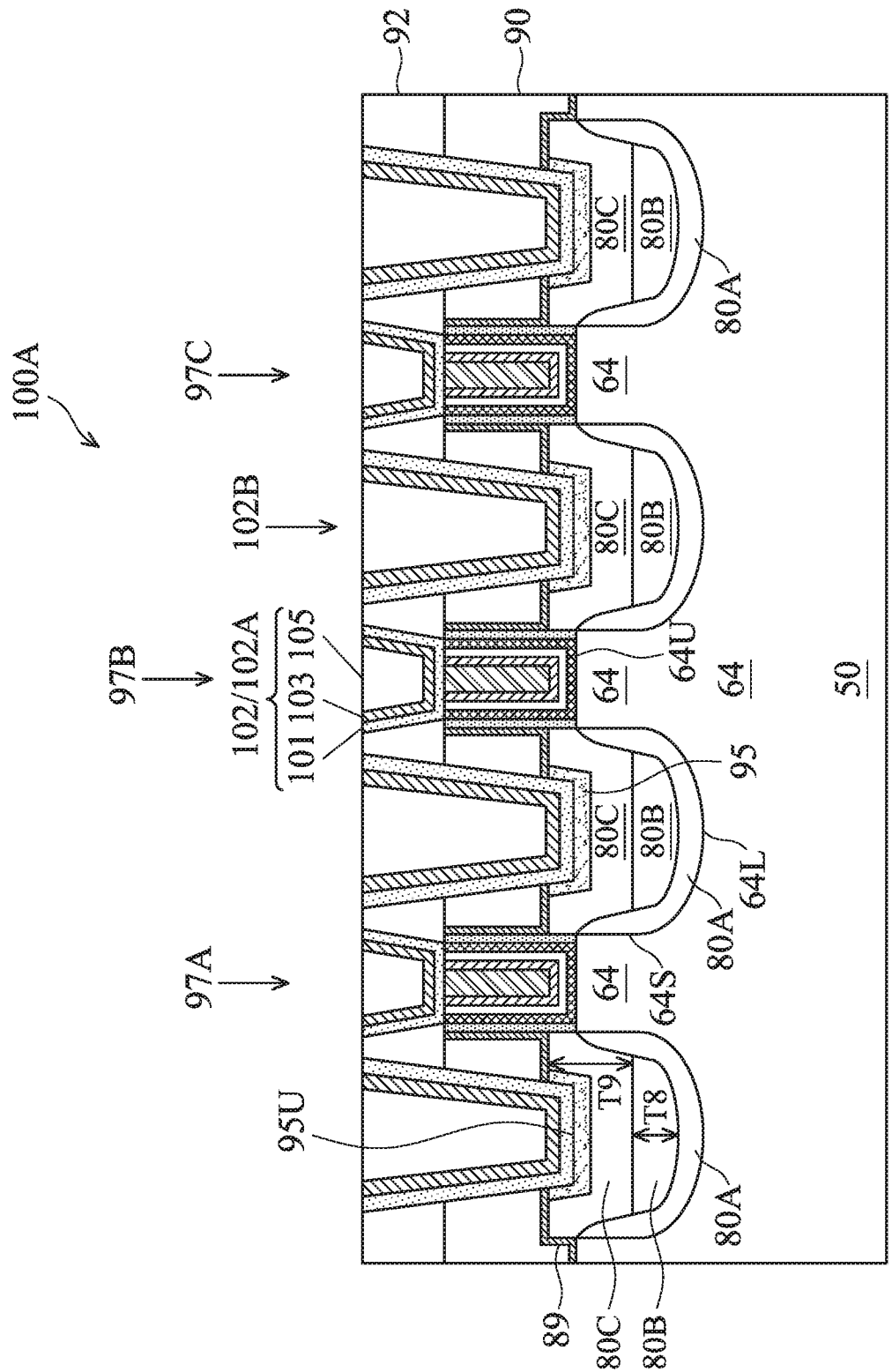
FIG. 15 illustrates a cross-sectional view of a FinFET device, in accordance with an embodiment.

FIG. 15 illustrates a cross-sectional view of a FinFET device 100A, in accordance with an embodiment. The FinFET device 100A is similar to the FinFET 100 in FIG. 14A, but with different shapes and/or dimensions for the layers 80B/80C of the source/drain regions 80. The different shapes and/or dimensions of the layers 80B/80C may be due to variations in the process conditions of the epitaxy process to form the layers 80B/80C. In FIGS. 15 and 14A, unless otherwise described, same or similar numerals refer to a same or similar feature formed by a same or similar process using a same or similar materials(s), thus details may not be repeated.

In FIG. 15, the layer 80A has a same shape and dimension as the layer 80A in FIG. 14A. For example, the layer 80A has a non-uniform thickness, where bottom portions of the layer 80A (e.g., portions along the lower surface 64L of the fin 64) are thicker than sidewall portions of the layer 80A (e.g., portions along the sidewall 64S of the fin 64). A concentration of the dopant (e.g., P or As) in the layer 80A is between about 5e20/cm3 and about 2e21/cm3, in the illustrated embodiment.

The layers 80B and 80C in FIG. 15 have different shapes and/or dimensions from the layers 80B and 80C in FIG. 14A. For example, the layer 80B in FIG. 15 has a substantially flat upper surface, and the layer 80B exposes (e.g., not covering) upper sidewall portions of the layer 80A. A thickness T8 of the layer 80B (e.g., measured between the upper surface and a bottom surface of the layer 80B) may be between about 15 nm and about 48 nm. A concentration of the dopant (e.g., P or As) in the layer 80B is between about $2e21/cm^3$ and about $3.5e21/cm^3$, in the illustrated embodiment.

The layer 80C in FIG. 15 fills the remaining portions of the recess 86 (see FIG. 9). An upper surface of the layer 80C extends above the upper surface 64U of the fin 64. A thickness T9 of the layer 80C may be between about 5 nm and about 35 nm. A concentration of the dopant (e.g., P or As) in the layer 80C is between about $3.5e21/cm^3$ and about $5e21/cm^3$, in the illustrated embodiment. In other words, the dopant concentration of the layer 80C is higher than that of the layer 80B, and the dopant concentration of the layer 80B is higher than that of the layer 80A. The profiles of the layers 80A/80B/80C illustrated in FIGS. 14A and 15 are merely examples, other profiles are also possible and are fully intended to be included within the scope of the present disclosure.

In FIG. 15, the etching process to form contact opening 91 (see FIG. 13) may over-etch, and the contact opening 91 may reach into the layer 80C. As a result, an upper surface 95U of the silicide regions 95 may be level with the upper surface 64U of the fin 64. In other embodiments, the upper surface 95U of the silicide regions 95 may be lower (e.g., closer to the substrate 50) than the upper surface 64U of the fin 64.

Figure 16:
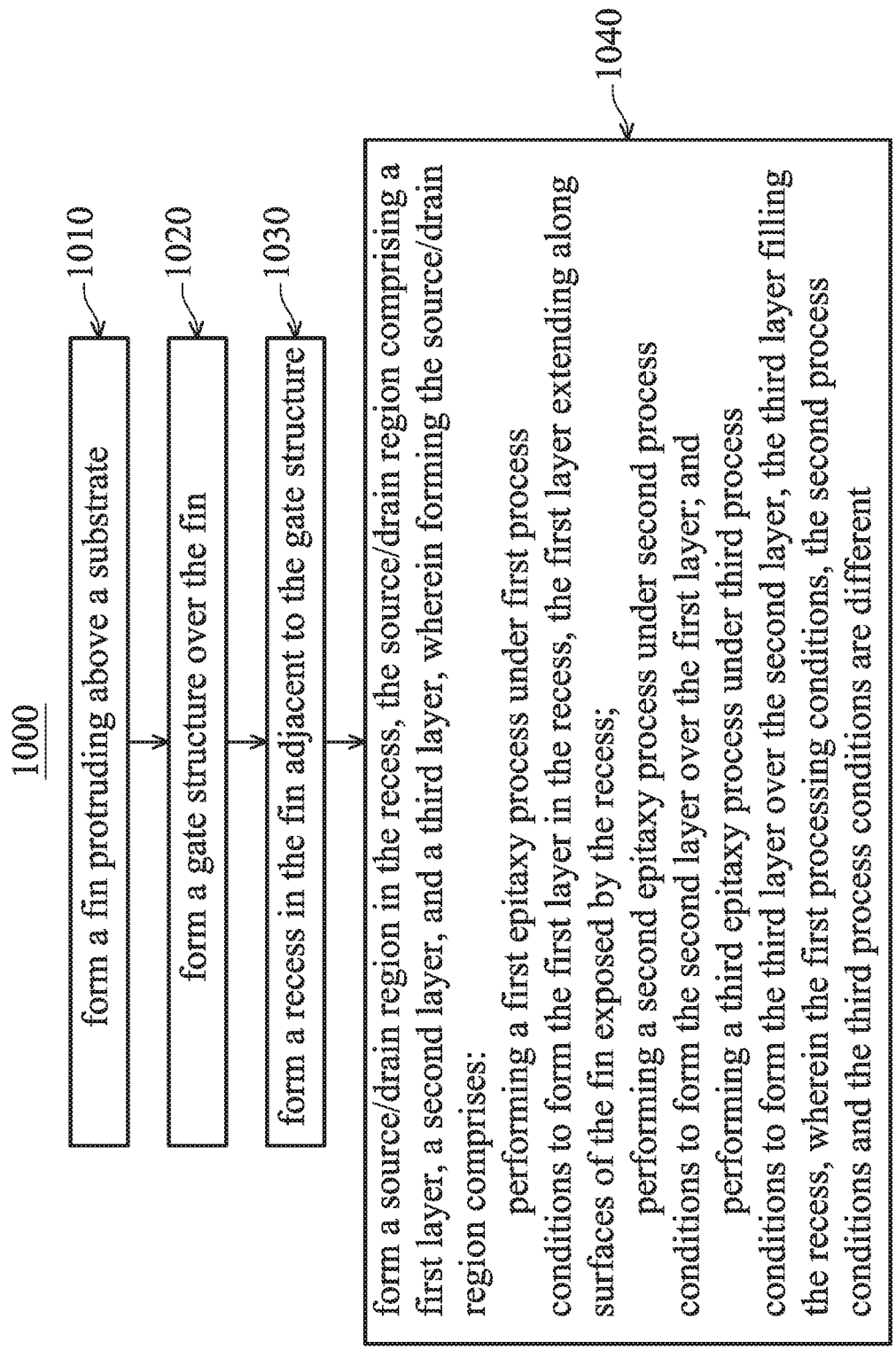
FIG. 16 illustrates a flow chart of method of making a semiconductor device, in accordance with some embodiments.

FIG. 16 illustrates a flow chart of a method 1000 of forming a semiconductor device, in accordance with some embodiments. It should be understood that the embodiment method shown in FIG. 16 is merely an example of many possible embodiment methods. One of ordinary skill in the art would recognize many variations, alternatives, and modifications. For example, various steps as illustrated in FIG. 16 may be added, removed, replaced, rearranged and repeated.

Referring to FIG. 16, at step 1010, a fin is formed protruding above a substrate. At step 1020, a gate structure is formed over the fin. At step 1030, a recess is formed in the fin adjacent to the gate structure. A step 1040, a source/drain region is formed in the recess, the source/drain region comprising a first layer, a second layer, and a third layer, wherein forming the source/drain region comprises: performing a first epitaxy process under first process conditions to form the first layer in the recess, the first layer extending along surfaces of the fin exposed by the recess; performing a second epitaxy process under second process conditions to form the second layer over the first layer; and performing a third epitaxy process under third process conditions to form the third layer over the second layer, the third layer filling the recess, wherein the first processing conditions, the second process conditions and the third process conditions are different.

Embodiments may achieve advantages. For example, the disclosed source/drain regions 80 have high dopant concentration, high activation rate, and good selective epitaxy growth property. The multi-layered structure and the different dopant concentrations of the layers (e.g., 80A/80B/80C) of the source/drain regions 80, among other factors, allows the FinFET device 100 to have reduced channel resistance with negligible performance penalty due to thermal drive-in of the dopant into the channel regions. Contact resistance of the FinFET device 100 is also reduced, due to, e.g., the larger volume and the high dopant concentration of the layer 80C. The reduced channel resistance and contact resistance improves the electrical performance of the FinFET device 100.

In an embodiment, a method of forming a semiconductor device includes forming a fin protruding above a substrate; forming a gate structure over the fin; forming a recess in the fin adjacent to the gate structure; and forming a source/drain region in the recess, the source/drain region including a first layer, a second layer, and a third layer, where forming the source/drain region includes performing a first epitaxy process under first process conditions to form the first layer in the recess, the first layer extending along surfaces of the fin exposed by the recess; performing a second epitaxy process under second process conditions to form the second layer over the first layer; and performing a third epitaxy process under third process conditions to form the third layer over the second layer, the third layer filling the recess, where the first processing conditions, the second process conditions and the third process conditions are different. In an embodiment, the first layer, the second layer, and the third layer are formed of a same epitaxial material comprising a semiconductor material and a dopant, where a first dopant concentration of the first layer, a second dopant concentration of the second layer, and a third dopant concentration of the third layer are different. In an embodiment, the epitaxial material is silicon phosphorous (SiP) or silicon arsenic (SiAs). In an embodiment, the third dopant concentration is higher than the second dopant concentration, and the second dopant concentration is higher than the first dopant concentration. In an embodiment, the first dopant concentration is between about $5e20/cm^3$ and about $2e21/cm^3$, the second dopant concentration is between about $2e21/cm^3$ and about $3.5e21/cm^3$, and the third dopant concentration is between about $3.5e21/cm^3$ and about $5e21/cm^3$. In an embodiment, the first layer is formed to have a non-uniform thickness, with a first sidewall portion of the first layer being thinner than a first bottom portion of the first layer, where the second layer is formed to have a non-uniform thickness, with a second sidewall portion of the second layer being thinner than a second bottom portion of the second layer. In an embodiment, the third layer is formed to have a lower portion extending below an upper surface of the fin, and to have an upper portion extending above the upper surface of the fin. In an embodiment, the first epitaxy process, the second epitaxy process, and the third epitaxy process are performed using same process gases but with different mixing ratios for the process gases, where the process gases comprise a silicon-containing gas, a dopant gas, and an etching gas. In an embodiment, a mixing ratio of the process gases is modified for each of the first epitaxy process, the second epitaxy process, and the third epitaxy process to achieve different dopant concentrations for the first layer, the second layer, and the third layer. In an embodiment, the first epitaxy process, the second epitaxy process, and third epitaxy process are performed in a same processing chamber and are three stages of a single continuously epitaxy process. In an embodiment, the method further includes forming a dielectric layer over the source/drain region and around the gate structure; replacing the gate structure with a replacement gate; forming an opening in the dielectric layer to expose the third layer of the source/drain region, where a bottom of the opening is level with an upper surface of the fin; and forming a contact in the opening, the contact electrically coupled to the source/drain region.

In an embodiment, a method of forming a semiconductor device includes forming a gate structure over a fin; forming a recess in the fin, the recess adjacent to a channel region of the fin; forming a first epitaxial layer in the recess, the first epitaxial layer having a first dopant concentration; forming a second epitaxial layer in the recess over the first epitaxial layer, the second epitaxial layer having a second dopant concentration higher than the first dopant concentration; and forming a third epitaxial layer over the second epitaxial layer, the third epitaxial layer having a third dopant concentration higher than the second dopant concentration. In an embodiment, the first epitaxial layer, the second epitaxial layer, and the third epitaxial layer are formed of a same epitaxial material that is silicon phosphorous (SiP) or silicon arsenic (SiAs). In an embodiment, the dopant of the same epitaxial material is phosphorous or arsenic, and the third dopant concentration is between about $3.5e21/cm^3$ and about $5e21/cm^3$. In an embodiment, the third epitaxial layer is formed to have a top portion extending above an upper surface of the fin, and a lower portion extending below the upper surface of the fin. In an embodiment, the top portion of the third epitaxial layer extends above the upper surface of the fin by about 3 nm to about 5 nm, and the lower portion extends below the upper surface of the fin by about 5 nm and about 10 nm.

In an embodiment, a semiconductor device includes a fin protruding above a substrate; a gate structure over the fin; and a source/drain region adjacent to the gate structure, where the source/drain region includes a first layer extending along sidewalls and a lower surface of the fin exposed by a recess in the fin, the first layer disposed below an upper surface of the fin, the first layer comprising an epitaxial material with a first dopant concentration; a second layer over the first layer and disposed below the upper surface of the fin, the second layer comprising the epitaxial material with a second dopant concentration higher than the first dopant concentration; and a third layer over the second layer and filling the recess, the third layer comprising the epitaxial material with a third dopant concentration higher than the second dopant concentration. In an embodiment, a first thickness of the first layer measured at the sidewalls of the fin is smaller than a second thickness of the first layer measured at the lower surface of the fin, where a third thickness of the second layer measured at the sidewalls of the fin is smaller than a fourth thickness of the second layer measured at the lower surface of the fin. In an embodiment, the third layer has an upper portion above the upper surface of the fin and a lower portion below the upper surface of the fin, where a distance between opposing sidewalls of the lower portion decreases as the lower portion extends toward the lower surface of the fin. In an embodiment, the epitaxial material is silicon phosphorus or silicon arsenic, and the third dopant concentration is between about $3.5e21/cm^3$ and about $5e21/cm^3$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming a fin protruding above a substrate;
   forming a gate structure over the fin;
   forming a recess in the fin adjacent to the gate structure; and
   forming a source/drain region in the recess, the source/drain region comprising a first layer, a second layer, and a third layer, wherein forming the source/drain region comprises:
     performing a first epitaxy process under first process conditions to form the first layer in the recess, the first layer extending along surfaces of the fin exposed by the recess;
     performing a second epitaxy process under second process conditions to form the second layer over the first layer; and
     performing a third epitaxy process under third process conditions to form the third layer over the second layer, the third layer filling the recess, wherein the first processing conditions, the second process conditions and the third process conditions are different, wherein the first epitaxy process, the second epitaxy process, and the third epitaxy process are Performed using same process gases but with different mixing ratios for the process gases, wherein the process gases comprise a silicon-containing gas, a dopant gas, and an etching gas.

2. The method of claim 1, wherein the first layer, the second layer, and the third layer are formed of a same epitaxial material comprising a semiconductor material and a dopant, wherein a first dopant concentration of the first layer, a second dopant concentration of the second layer, and a third dopant concentration of the third layer are different.

3. The method of claim 2, wherein the epitaxial material is silicon phosphorous (SiP) or silicon arsenic (SiAs).

4. The method of claim 2, wherein the third dopant concentration is higher than the second dopant concentration, and the second dopant concentration is higher than the first dopant concentration.

5. The method of claim 4, wherein the first dopant concentration is between about $5e21/cm^3$ and about $2e21/cm^3$, the second dopant concentration is between about $2e21/cm^3$ and about $3.5e21/cm^3$, and the third dopant concentration is between about $3.5e21/cm^3$ and about $5e21/cm^3$.

6. The method of claim 4, wherein the first layer is formed to have a non-uniform thickness, with a first sidewall portion of the first layer being thinner than a first bottom portion of the first layer, wherein the second layer is formed to have a non-uniform thickness, with a second sidewall portion of the second layer being thinner than a second bottom portion of the second layer.

7. The method of claim 6, wherein the third layer is formed to have a lower portion extending below an upper surface of the fin, and to have an upper portion extending above the upper surface of the fin.

8. The method of claim 1, wherein a mixing ratio of the process gases is modified for each of the first epitaxy process, the second epitaxy process, and the third epitaxy process to achieve different dopant concentrations for the first layer, the second layer, and the third layer.

9. The method of claim 8, wherein the first epitaxy process, the second epitaxy process, and third epitaxy process are performed in a same processing chamber and are three stages of a single continuously epitaxy process.

10. The method of claim 1, further comprising:
   forming a dielectric layer over the source/drain region and around the gate structure;
   replacing the gate structure with a replacement gate;
   forming an opening in the dielectric layer to expose the third layer of the source/drain region, wherein a bottom of the opening is level with an upper surface of the fin; and
   forming a contact in the opening, the contact electrically coupled to the source/drain region.

11. A method of forming a semiconductor device, the method comprising:
   forming a gate structure over a fin;
   forming a recess in the fin, the recess adjacent to a channel region of the fin;
   forming a first epitaxial layer in the recess, the first epitaxial layer contacting and extending along sidewalls and a bottom surface of the recess, the first epitaxial layer having a first dopant concentration that is larger than zero;
   forming a second epitaxial layer in the recess over and contacting the first epitaxial layer, the second epitaxial layer having a second dopant concentration higher than the first dopant concentration; and
   forming a third epitaxial layer over and contacting the second epitaxial layer, a lower surface of the third epitaxial layer extending below an upper surface of the fin, an upper surface of the third epitaxial layer extending above the upper surface of the fin, the third epitaxial layer having a third dopant concentration higher than the second dopant concentration.

12. The method of claim 11, wherein the first epitaxial layer, the second epitaxial layer, and the third epitaxial layer are formed of a same epitaxial material that is silicon phosphorous (SiP) or silicon arsenic (SiAs).

13. The method of claim 12, wherein the dopant of the same epitaxial material is phosphorous or arsenic, and the third dopant concentration is between about $3.5e21/cm^3$ and about $5e21/cm^3$.

14. The method of claim 11, wherein the upper surface of the third epitaxial layer extends above the upper surface of the fin by about 3 nm to about 5 nm, and the lower surface of the third epitaxial layer extends below the upper surface of the fin by about 5 nm and about 10 nm.

15. The method of claim 11, wherein the first epitaxial layer, the second epitaxial layer, and the third epitaxial layer are formed using same process gases but with different mixing ratios for the process gases.

16. The method of claim 15, wherein the process gases comprise a silicon-containing gas, a dopant gas, and an etching gas.

17. The method of claim 11, further comprising:
   forming a dielectric layer over the third epitaxial layer and around the gate structure;
   replacing the gate structure with a replacement gate;
   forming an opening in the dielectric layer to expose the third epitaxial layer, wherein a bottom of the opening is level with an upper surface of the fin; and
   forming a contact in the opening, the contact electrically coupled to the third epitaxial layer.

18. A semiconductor device comprising:
   a fin protruding above a substrate;
   a gate structure over the fin; and
   a source/drain region adjacent to the gate structure, wherein the source/drain region comprises:
      a first layer extending along sidewalls and a lower surface of the fin exposed by a recess in the fin, the first layer disposed below an upper surface of the fin, the first layer comprising an epitaxial material with a first dopant concentration;
      a second layer over the first layer and disposed below the upper surface of the fin, the second layer comprising the epitaxial material with a second dopant concentration higher than the first dopant concentration; and
      a third layer over the second layer and filling the recess, the third layer comprising the epitaxial material with a third dopant concentration higher than the second dopant concentration, wherein the epitaxial material is silicon phosphorus or silicon arsenic, and the third dopant concentration is between about $3.5e21/cm^3$ and about $5e21/cm^3$.

19. The semiconductor device of claim 18, wherein a first thickness of the first layer measured from the sidewalls of the fin is smaller than a second thickness of the first layer measured from the lower surface of the fin, wherein a third thickness of the second layer measured from the sidewalls of the fin is smaller than a fourth thickness of the second layer measured from the lower surface of the fin.

20. The semiconductor device of claim 19, wherein the third layer has an upper portion above the upper surface of the fin and a lower portion below the upper surface of the fin, wherein a distance between opposing sidewalls of the lower portion decreases as the lower portion extends toward the lower surface of the fin.

* * * * *